(12) United States Patent
Huang et al.

(10) Patent No.: US 11,916,009 B2
(45) Date of Patent: *Feb. 27, 2024

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Chi-Ming Huang, Changhua County (TW); Ping-Kang Huang, Chiayi (TW); Sao-Ling Chiu, Hsinchu (TW); Shang-Yun Hou, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/827,980

(22) Filed: May 30, 2022

(65) Prior Publication Data
US 2022/0293508 A1 Sep. 15, 2022

Related U.S. Application Data

(63) Continuation of application No. 16/830,284, filed on Mar. 26, 2020, now Pat. No. 11,373,946.

(51) Int. Cl.
| | | |
|---|---|---|
| H01L 23/48 | (2006.01) | |
| H01L 23/498 | (2006.01) | |
| H01L 23/31 | (2006.01) | |
| H01L 21/48 | (2006.01) | |

(Continued)

(52) U.S. Cl.
CPC .... H01L 23/49861 (2013.01); H01L 21/4846 (2013.01); H01L 21/56 (2013.01); H01L 21/78 (2013.01); H01L 23/3121 (2013.01); H01L 23/49838 (2013.01)

(58) Field of Classification Search
CPC ......... H01L 23/49838; H01L 23/49861; H01L 23/3121
See application file for complete search history.

(56) References Cited

U.S. PATENT DOCUMENTS

| | | | | |
|---|---|---|---|---|
| 8,518,752 B2* | 8/2013 | Yang | .................. | H01L 23/49833 |
| | | | | 438/126 |
| 10,593,630 B2* | 3/2020 | Fang | ..................... | H01L 23/367 |
| 10,636,715 B2* | 4/2020 | Lin | ..................... | H01L 23/5385 |

(Continued)

*Primary Examiner* — Nicholas J Tobergte
(74) *Attorney, Agent, or Firm* — JCIPRNET

(57) ABSTRACT

A semiconductor package and a manufacturing method thereof are provided. The semiconductor package includes at least one semiconductor die, an interposer, a molding compound and connectors. The interposer has a first surface, a second surface opposite to the first surface and sidewalls connecting the first and second surfaces. The at least one semiconductor die is disposed on the first surface of interposer and electrically connected with the interposer. The molding compound is disposed over the interposer and laterally encapsulates the at least one semiconductor die. The molding compound laterally wraps around the interposer and the molding compound at least physically contacts a portion of the sidewalls of the interposer. The connectors are disposed on the second surface of the interposer, and are electrically connected with the at least one semiconductor die through the interposer.

20 Claims, 22 Drawing Sheets

(51) Int. Cl.
  *H01L 21/56* (2006.01)
  *H01L 21/78* (2006.01)

(56) References Cited

U.S. PATENT DOCUMENTS

| | | | |
|---|---|---|---|
| 2004/0191958 A1* | 9/2004 | Hedler | H01L 23/3128 |
| | | | 257/E23.021 |
| 2017/0345795 A1* | 11/2017 | Yang | H01L 24/09 |
| 2019/0139845 A1* | 5/2019 | Lin | H01L 23/3114 |
| 2020/0258801 A1* | 8/2020 | Lin | H01L 25/0655 |
| 2021/0202436 A1* | 7/2021 | Yeh | H01L 25/0655 |

* cited by examiner

SEMICONDUCTOR PACKAGE AND MANUFACTURING METHOD THEREOF

CROSS-REFERENCE TO RELATED APPLICATION

This application is a continuation application and claims the priority benefit of U.S. patent application Ser. No. 16/830,284, filed on Mar. 26, 2020 and now allowed. The entirety of the above-mentioned patent application is hereby incorporated by reference herein and made a part of this specification.

BACKGROUND

For multi-die packages, the choices and the arrangement of the packaging materials relative to the packaged semiconductor dies have become an important issue for packaging technology and have impacts on reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
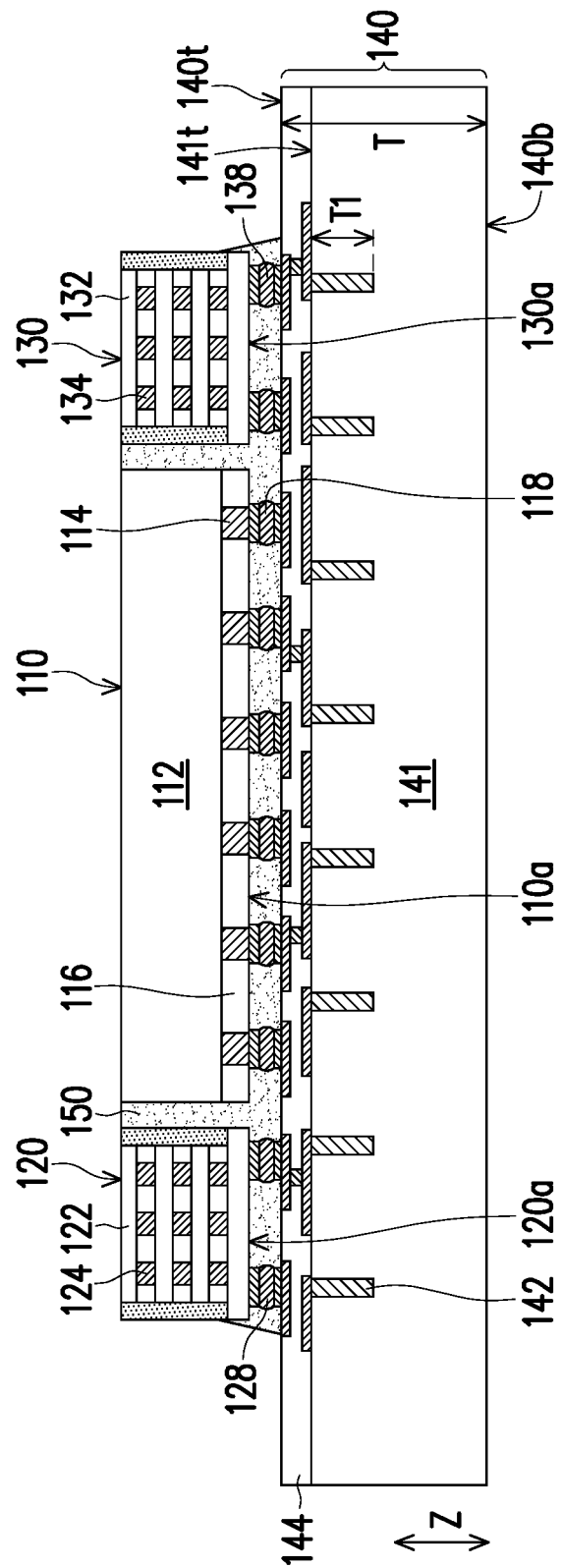
FIG. 1 through FIG. 8 are schematic cross-sectional views illustrating the structures formed at various stages of a manufacturing method of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 8 are schematic cross-sectional views illustrating the structures formed at various stages of a manufacturing method of a semiconductor package according to some embodiments of the present disclosure.

Referring to FIG. 1, in some embodiments, an interposer 140 is provided and semiconductor dies 110, 120, 130 are provided and mounted to the interposer 140. For example, the semiconductor dies 110, 120, 130 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor dies 110, 120, 130 may independently be or include a memory die such as a high bandwidth memory (HBM) die. In some embodiments, the semiconductor dies 110, 120, 130 may be the same type of dies or perform the same functions. In some embodiments, the semiconductor dies 110, 120, 130 may be different types of dies or perform different functions. In certain embodiments, the semiconductor die 110 may include a logic die, and the semiconductor dies 120 and 130 include memory dies.

Referring to FIG. 1, in some embodiments, the semiconductor die 110 includes a semiconductor substrate 112, a plurality of contact terminals 114 and a passivation layer 116. The contact terminals 114 may be formed on the semiconductor substrate 112 covered by the passivation layer 116 and be exposed of the passivation layer 116. In some embodiments, the contact terminals 114 of the semiconductor die 110 are connected to the interposer through die connectors 118. In some embodiments, the surface of the semiconductor die 110 in which the contact terminals 114 are exposed is referred to as an active surface 110a.

In some embodiments, the semiconductor substrate 112 may be made of semiconductor materials, such as semiconductor materials of the groups III-V of the periodic table. In some embodiments, the semiconductor substrate 112 includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor substrate 112 may include silicon on insulator (SOI) or silicon-germanium on insulator (SGOI). In some embodiments, the semiconductor substrate 112 includes active components (e.g., transistors or the like) and optionally passive components (e.g., resistors, capacitors, inductors, or the like) formed therein. In certain embodiments, the contact terminals 114 include aluminum pads, copper posts, or other suitable metal pads. In some embodiments, the passivation layer 116 may be a single layer or a multi-layered structure, including a silicon oxide layer, a silicon nitride layer, a silicon oxy-nitride layer, a dielectric layer formed by other suitable dielectric materials or combinations thereof. In some embodiments, the die connectors 118 includes copper, copper alloys, solder materials or other conductive materials, and may be formed by deposition, plating, or other suitable techniques. In some embodiments, the die connectors 118 include metal pillars, micro bumps, or metal pillars with solder materials thereon, or the like. In some embodiments, similar structural features as the ones just discussed for the semiconductor die 110 may be found in the other semiconductor dies of the semiconductor package 80 being formed (for example, in the semiconductor dies 120, 130 shown in FIG. 1).

In some embodiments, referring to FIG. 1, the semiconductor dies 120 and 130 are memory dies including multiple memory chips 122, 132 stacked on top of a controller chip and electrically connected by the connectors 124, 134. In some embodiments, the semiconductor dies 120, 130 include die connectors 128, 138 to electrically connect with other components or devices.

In some embodiments, referring to FIG. 1, the interposer 140 may be a semiconductor wafer (such as a silicon wafer). The interposer 140 may be made of a semiconductor material, similarly to what was previously discussed with reference to the semiconductor substrate 112. The interposer 140 may be considered as an interposer substrate having a plurality of interposer units joined together and shall be cut into multiple units after the later performed singulation process. In some embodiments, the interposer 140 includes conductive vias 142 formed within a semiconductor material bulk substrate 141 and a redistribution structure 144 formed on the bulk substrate 141. In FIG. 1, the conductive vias 142 are embedded within the bulk substrate 141 and are connected with the redistribution structure 144.

In some embodiments, the semiconductor dies 110, 120, 130 are bonded to the metallic patterns of the redistribution structure 144 via the connectors 118, 128, 138 and are electrically connected with the conductive vias 142 formed within the bulk substrate 141. The interposer 140 has a top surface 140$t$, a bottom surface 140$b$ and side surfaces (i.e. sidewalls) 140$s$ connecting the top and bottom surfaces. According to some embodiments, the semiconductor dies 110, 120, 130 are disposed with the active surfaces 110$a$, 120$a$, 130$a$ facing the mounting surface 140$t$ of the interposer 140. In some embodiments, as illustrated in FIG. 1, the conductive vias 142 may extend from a top surface 141$t$ of the bulk substrate 141, and extend in a thickness direction Z of the interposer 140 without emerging on the bottom surface 140$b$ of the interposer 140. According to some embodiments, the conductive vias 142 may penetrate into the bulk substrate 141 with a length T1, which is only a fraction of the whole thickness T of the interposer 140 (measuring from its top surface 140$t$ to its bottom surface 140$b$ in the thickness direction Z). That is, the length T1 of the conductive vias 142 is smaller than the thickness T of the interposer 140. In some embodiments, a material of the conductive vias 142 includes a metal material such as copper, titanium, tungsten, aluminum, combinations thereof, alloys thereof or the like. In some embodiments, the redistribution structure 144 may be optional and pads (not shown) may be formed on the conductive vias 142 and passivation layers (not shown) may be formed on the surface of the interposer 140 with openings exposing the pads and the conductive vias 142.

In some embodiments, the semiconductor dies 110, 120, 130 are bonded to the interposer 140 through a bonding process, and the conductive vias 142 and the redistribution structure 144 are electrically connected with the semiconductor dies 110, 120, 130. In one embodiment, the bonding process includes performing a heating process or a reflow process. After bonding the semiconductor dies 110, 120, 130 to the interposer 140, an underfill 150 may be provided and filled between the semiconductor dies 110, 120, 130 and the interposer 140 to protect the die connectors 118, 128, 138 against thermal or physical stresses and secure the electrical connection of the semiconductor dies 110, 120, 130 with the interposer 140. In some embodiments, the underfill 150 is formed by capillary underfill filling (CUF). In some embodiments, a curing process may be performed to consolidate the underfill 150. In some embodiments, as shown in FIG. 1, the underfill 150 not only fills up the interstices between the die connectors 118, 128, 138 for securing the connectors 118, 128, 138, but also fills into the gaps between the semiconductor dies 110, 120, 130. In some alternative embodiments, the underfill 150 may overflow and extend beyond the semiconductor dies 110, 120, 130, depending on the spacing and relative positions of the semiconductor dies 110, 120, 130 over the interposer 140.

It is understood that only three semiconductor dies 110, 120, 130 are shown on the interposer 140 in FIG. 1 for simplicity, but the disclosure is not limited thereto. In some embodiments, the semiconductor package may include more or fewer semiconductor dies, as well as other components (e.g., passive components, interconnect structures, support structures, etc.). Furthermore, whilst the process is currently being illustrated for a Chip-on-Wafer-on-Substrate (CoWoS) package, the disclosure is not limited to the package structure shown in the drawings, and other types of wafer level packages are also meant to be covered by the present disclosure and to fall within the scope of the appended claims.

Figure 2:
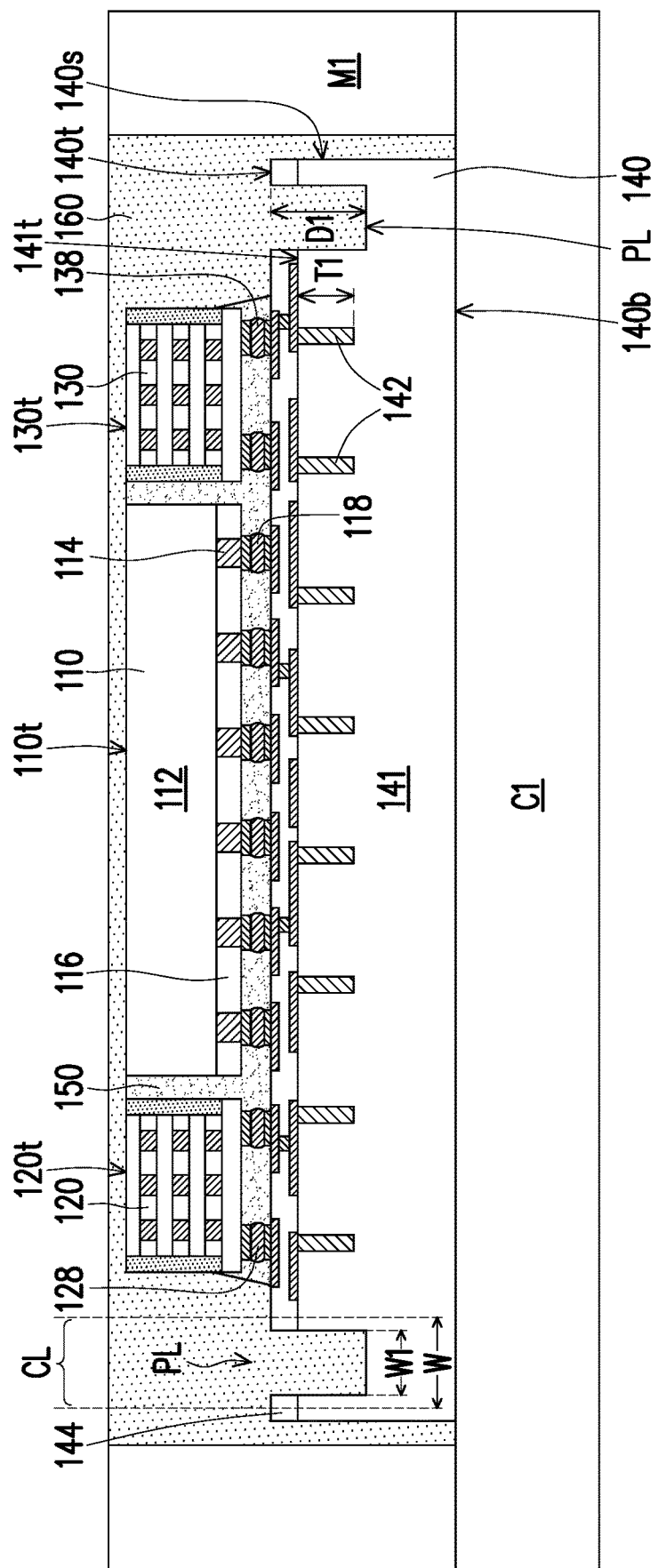

Referring to FIG. 2, a pre-cutting process is performed to the interposer 140 along the cutting lanes CL to form pre-cut lanes PL in the interposer 140. In certain embodiments, the cutting lane CL has a width W larger than a width W1 of the pre-cut lane PL that is located within the span of the cutting lane CL. In one embodiment, the pre-cut lane PL may be shaped as a square or rectangular ring surrounding the dies and along the peripheral region(s) of the to-be-formed package unit. In some embodiments, the pre-cutting process includes performing a dicing process with a rotating blade. In some embodiments, the pre-cutting process includes performing a laser cutting process using a laser beam. In some embodiments, the pre-cut lanes PL are cut into the bulk substrate 141 of the interposer 140 with a depth D1. In some embodiments, the depth D1 is measuring from the top surface 140$t$ of the interposer 140 to the bottom of the pre-cut lane(s) PL, and the pre-cut lanes PL do not penetrate through the whole thickness T of the interposer 140 (i.e. not cutting through the bulk substrate 141). In some embodiments, the depth D1 of the pre-cut lanes PL is larger than the length T1 of the conductive vias 142 but is smaller than the thickness T of the interposer 140, and the bottoms of the pre-cut lanes PL are lower than the bottom ends of the conductive vias 142. In some embodiments, the depth D1 of the pre-cut lanes PL is substantially equivalent to the length T1 of the conductive vias 142 but is smaller than the thickness T of the interposer 140.

Figure 3:
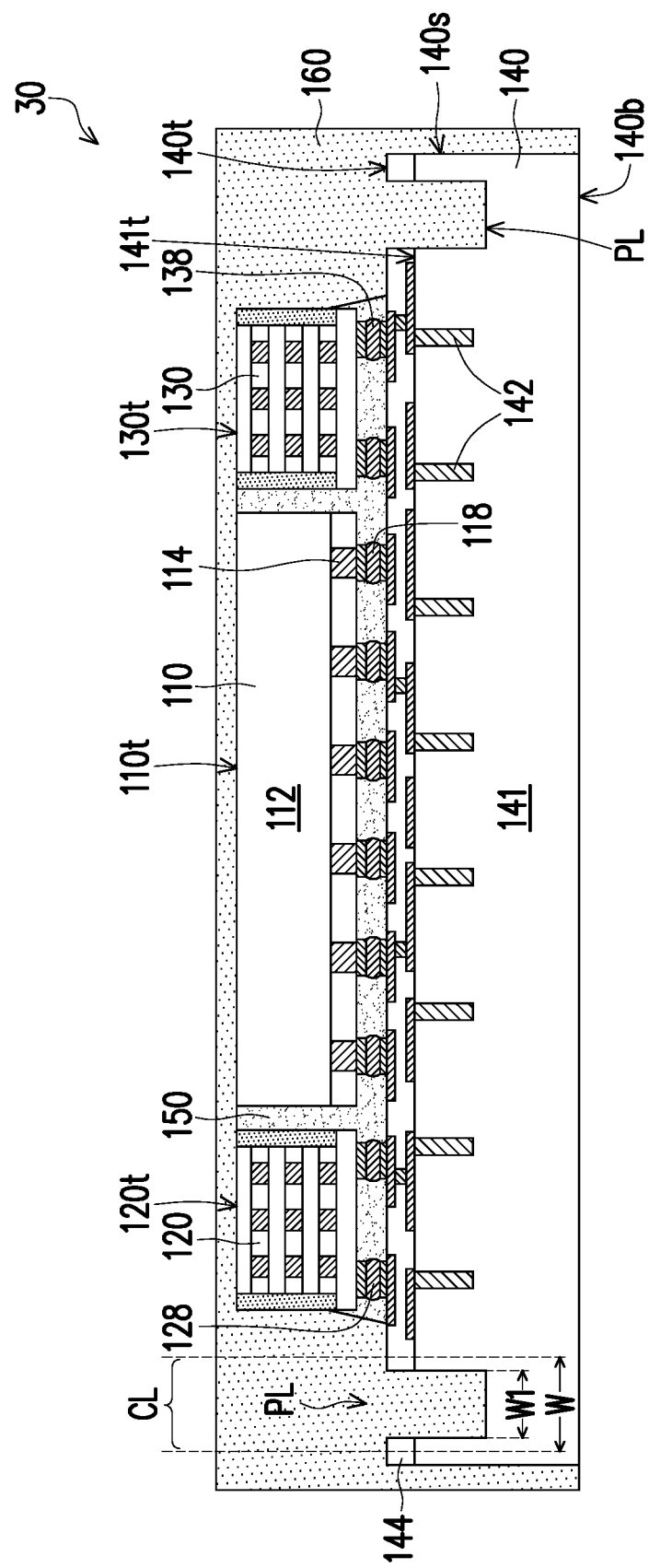

In FIG. 2 & FIG. 3, the interposer 140 together with the semiconductor dies 110, 120, 130 are placed on a carrier C1 having a mold M1 formed thereon. Then, a molding compound 160 is formed over the carrier C1 within the mold M1 encapsulating the interposer 140 and wrapping the semiconductor dies 110, 120, 130 and the underfill 150. In some embodiments, the molding compound 160 is formed by supplying an encapsulation material (not shown) into the mold M1 completely covering the semiconductor dies 110, 120, 130, the underfill 150 and the interposer 140, filling up the pre-cut lanes PL and then performing a curing process. In some embodiments, the molding compound 160 is formed through over-molding and the molding compound 160 is formed to cover the top surfaces 110t, 120t, 130t of the semiconductor dies 110, 120, 130, fill up the pre-cut lanes PL and cover the side surfaces 140s of the interposer 140. In some embodiments, the encapsulation material of the molding compound 160 includes a resin such as an epoxy resin, a phenolic resin or thermosetting resin materials. After forming the molding compound 160, the carrier C1 and the mold M1 are removed and a molded structure 30 is formed with the molding compound 160 encapsulating the semiconductor dies 110, 120, 130 and laterally wrapping the interposer 140 (with its bottom surface 140b is exposed).

Figure 4:
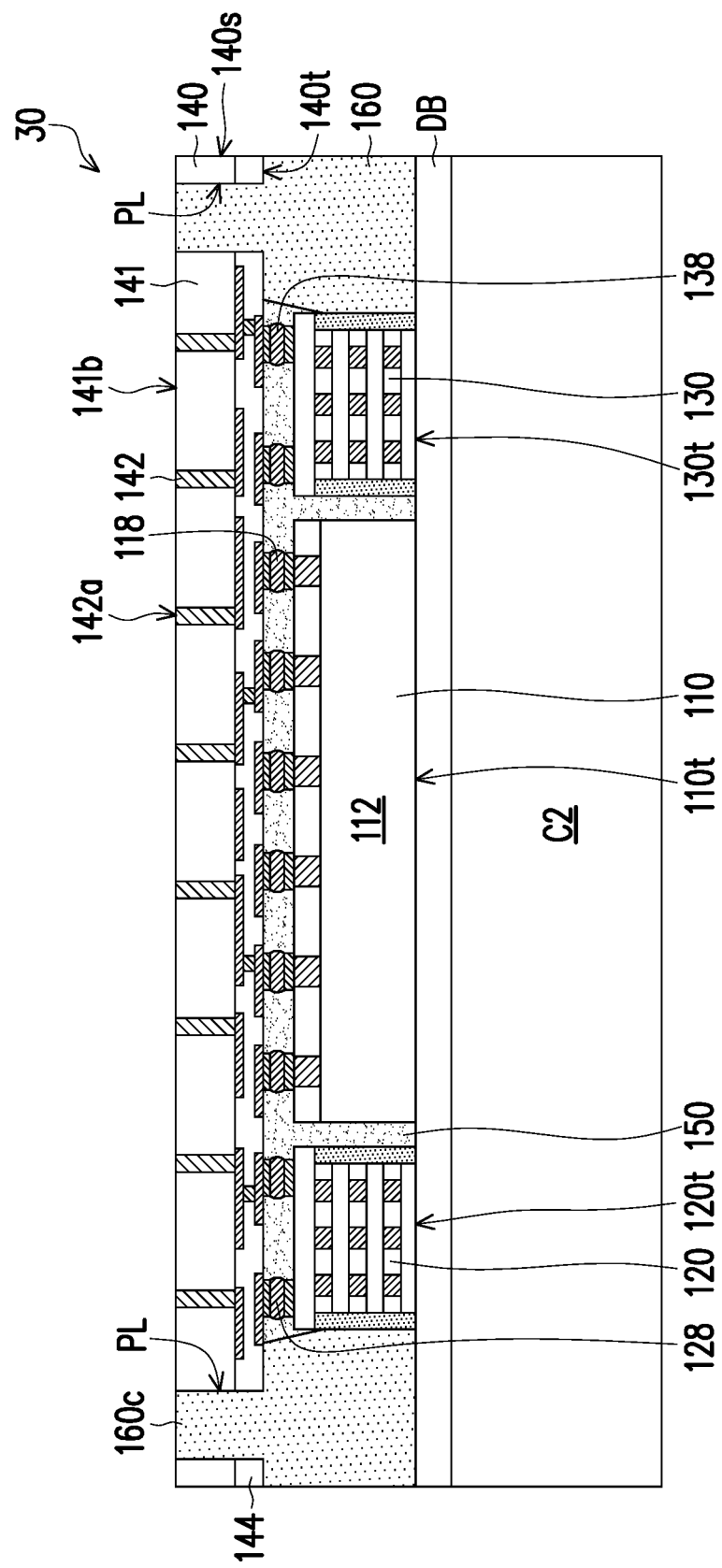

Referring to FIG. 3 & FIG. 4, a trimming process and a planarization process are performed to the molded structure 30. In some embodiments, the trimming process removes edge portions of the molded structure 30, especially the outermost ring portion(s) of the molding compound 160 that is located outer than and outside the side surfaces 140s of the interposer 140 until the side surfaces 140s of the interposer 140 are exposed. For example, the planarization process is performed to the molded structure 30 until the top surfaces 110t, 120t, 130t of the semiconductor dies 110, 120, 130 are exposed. In some embodiments, the planarization process includes performing a mechanical grinding process or a chemical mechanical polishing (CMP) process.

In some embodiments, in FIG. 4, the molded structure 30 is turned upside down so that the backside of the molded structure 30 faces upward. Then the molded structure 30 is transferred to a temporary carrier C2 having a de-bonding layer DB formed thereon. In some embodiments, a thinning process is performed to the backside of the molded structure 30 (i.e. the bottom surface 140b of the interposer 140), removing portions of the bulk substrate 141 and the molding compound 160, until the conductive vias 142 are exposed. In some embodiments, the thinning process includes performing a mechanical grinding process, an etching process (i.e. silicon etching process) or a chemical mechanical polishing (CMP) process. In some embodiments, the ends 142a of the conductive vias 142 are exposed from the surface 141b of the bulk substrate 141 of the thinned interposer 140. In one embodiment, the conductive vias 142 extending through the thinned interposer 140 are through semiconductor vias (TSVs). In some embodiments, during the thinning process, the molding compound 160 filled in the pre-cut lanes PL are exposed from the backside of the thinned interposer 140 (exposed from the surface 141b of the bulk substrate 141).

In one embodiment, the exposed molding compound 160 that is filled in the pre-cut lanes PL may be referred to as cutting lane portion(s) 160c. That is, the ends 142a of the conductive vias 142 are co-levelled and coplanar with the surface 141b of the bulk substrate 141 and the top surface(s) of the cutting lane portion(s) 160c. Since the depth D1 of the pre-cut lanes PL is equivalent to or larger than the length T1 of the conductive vias 142, portions of the interposer 140 that are located outer than and outside the pre-cut lanes PL are separate from the remaining portions of the interposer 140 by the cutting lane portions 160c of the molding compound 160.

In alternative embodiments, the depth D1 of the pre-cut lanes PL is smaller than the length T1 of the conductive vias 142, and the interposer 140 remains as an integral piece after forming the pre-cut lanes PL.

In some embodiments, the temporary carrier C2 is a glass substrate, a metal plate, a plastic supporting board or the like. In some embodiments, the de-bonding layer DB includes a light-to-heat conversion (LTHC) release layer, which facilitates separating the temporary carrier from the semiconductor package when required by the manufacturing process.

Figure 5:
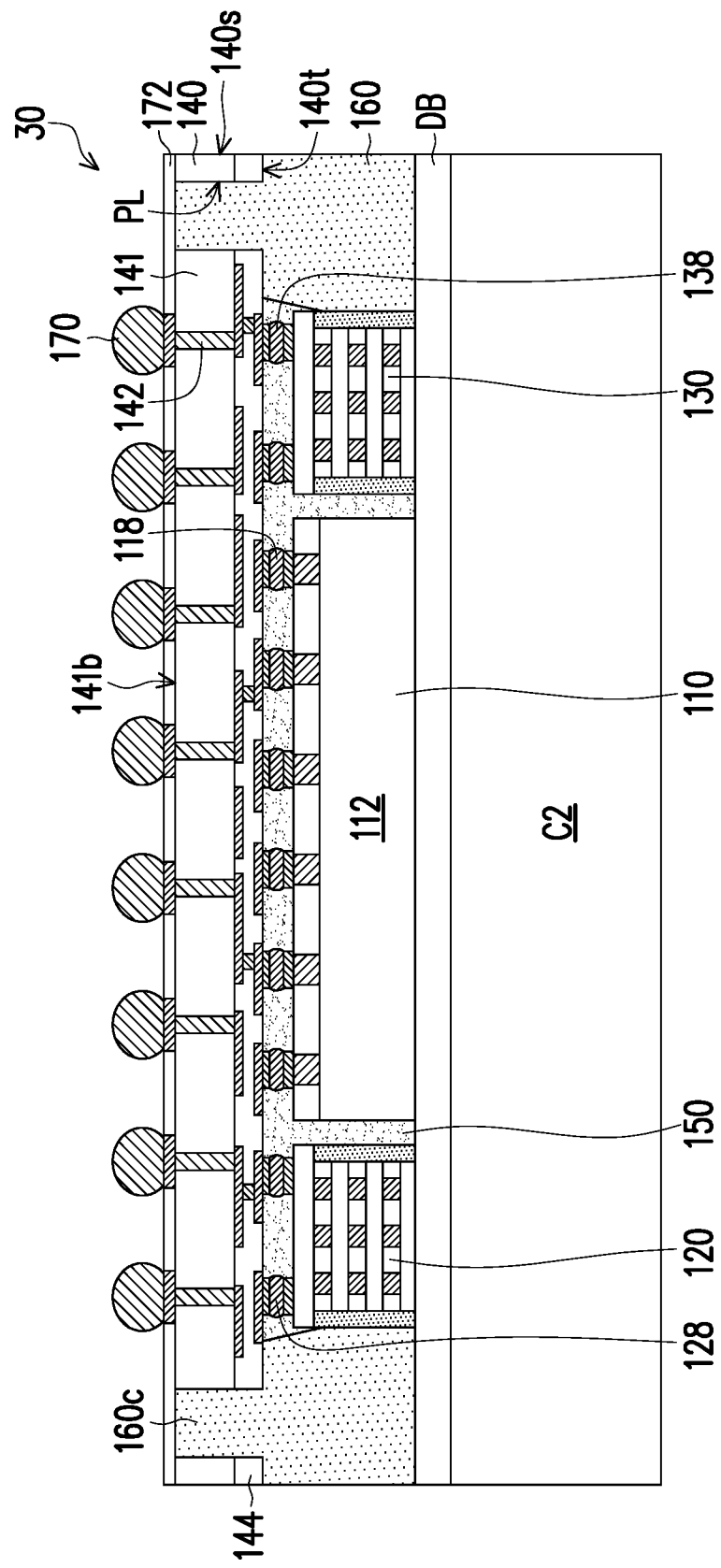

Referring to FIG. 5, connectors 170 are formed on the exposed conductive vias 142 to provide electrical connection with other components. For example, the connectors 170 may include controlled collapse chip connection (C4) bumps, micro bumps, metal pillars with solder materials, combination thereof, or the like. In some embodiments, under-bump metallurgies (not shown) may be formed on the exposed conductive vias 142 before providing the connectors 170. In some embodiments, some connectors 170 are electrically connected with the semiconductor die 110, 120, 130 through the conductive vias 142 of the interposer 140. A passivation layer 172 including openings exposing the conductive vias 142 may optionally be formed on the bottom surface 140b after the thinning process and before forming the connectors 170.

Figure 6:
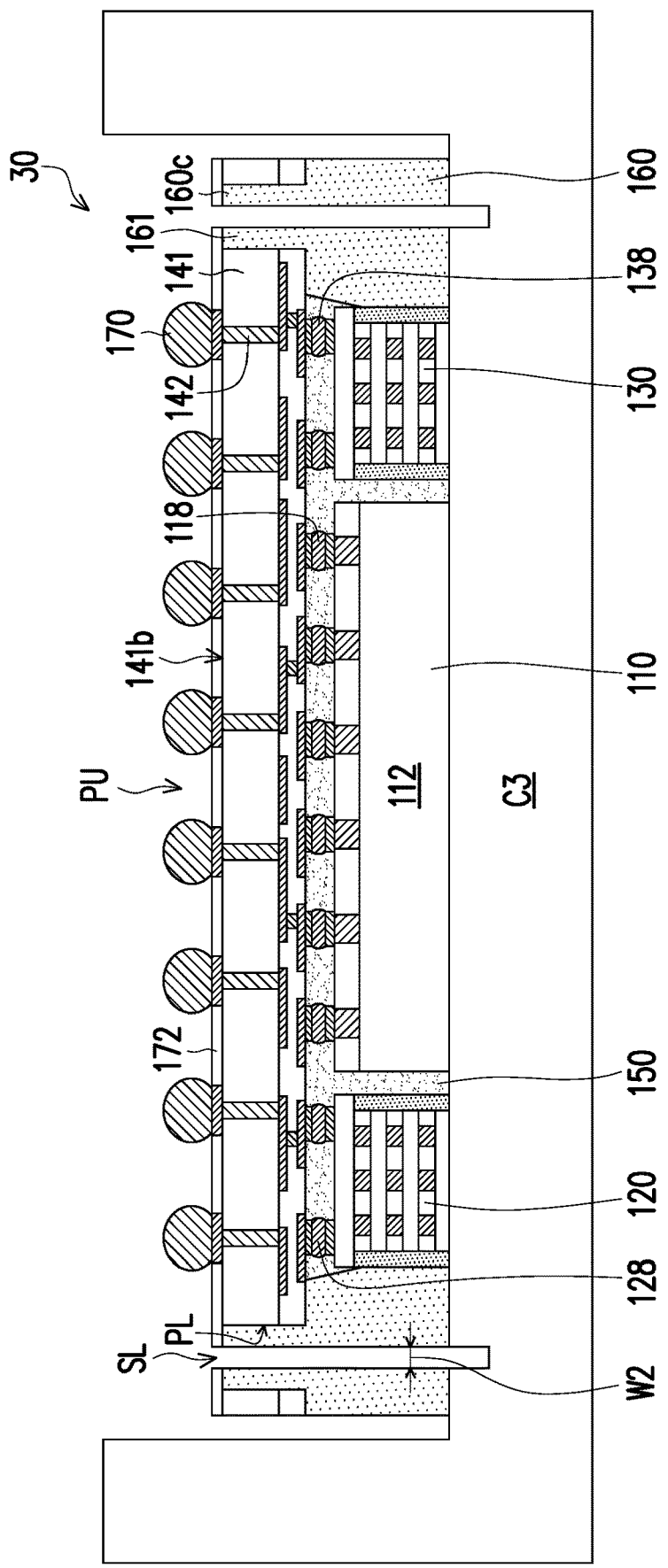

Referring to FIG. 6, the molded structure 30 is de-bonded from the temporary carrier C2 and transferred to another carrier C3.

Figure 8:
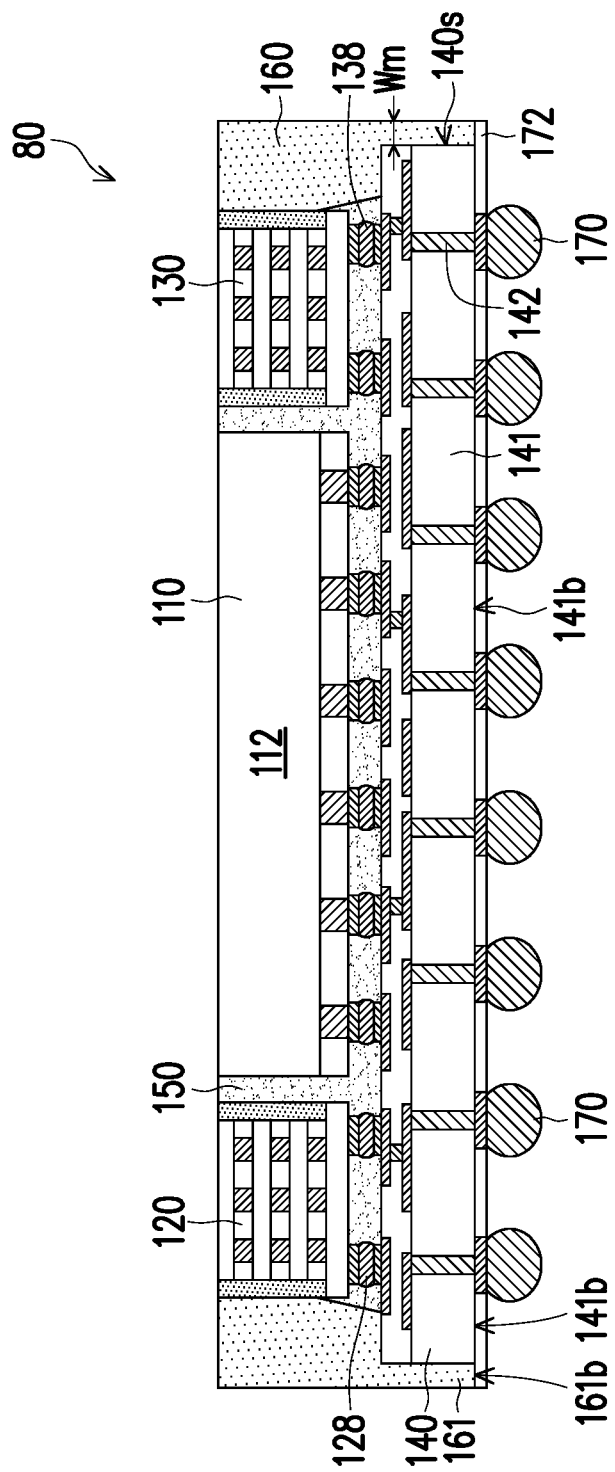

In FIGS. 1-6, only a single package unit is shown for simplicity, however, the disclosure is not limited thereto. In some embodiments, multiple package units are formed simultaneously on the interposer 140. In other words, the exemplary processes may be performed at a reconstructed wafer level, so that multiple package units are processed in the form of a molded structure or reconstructed wafer. In some embodiments, the molded structure 30 includes a plurality of package units PU. According to some embodiments, the package units PU are similar to the semiconductor package 80 (as shown in FIG. 8).

In some embodiments, as shown in FIG. 6, a singulation process is performed to the molded structure 30 to separate the individual package units PU, for example, by cutting through the molded structure 30 along the pre-cut lanes PL. In some embodiments, the singulation process includes performing a wafer dicing process or a wafer sawing process with a rotating blade. In some embodiments, the singulation process includes performing a laser cutting process. In some embodiments, the dicing or cutting process is performed cutting into the cutting lane portions 160c of the molding compound 160, cutting through the molding compound 160 and cutting into the carrier C3 to form scribing lanes SL and to separate the package unit(s) PU. Through the formation of the scribing lanes SL, the package unit PU is singulated, and a portion of the molding compound 160 is cut off and separate from the remaining portions of the molding compound 160.

Figure 13:
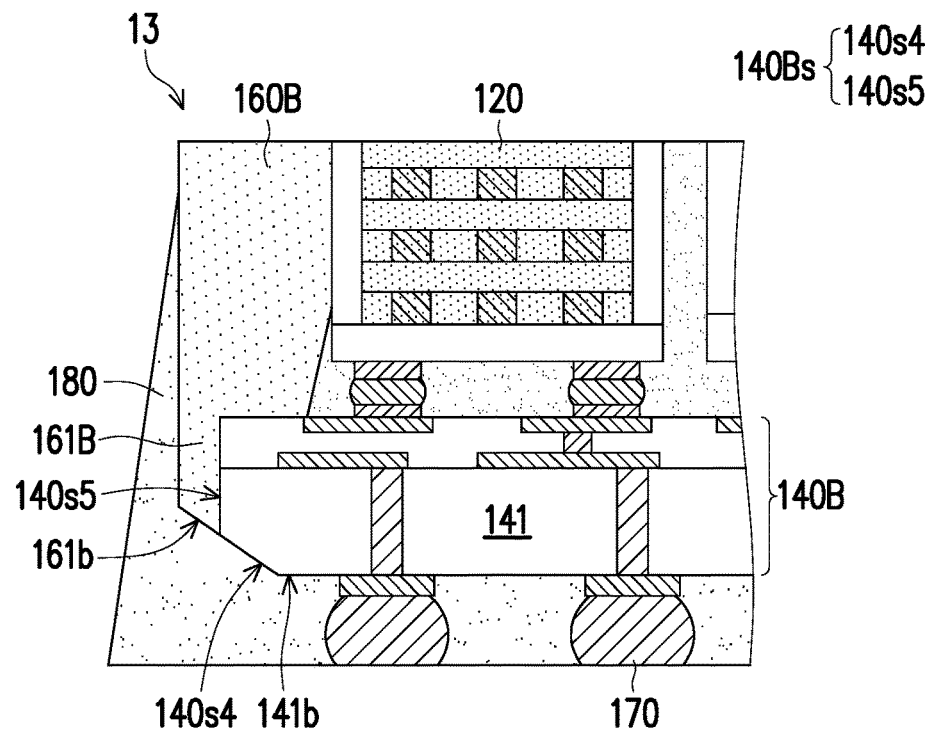

In alternative embodiments, the singulation process includes performing a bevel cutting process cutting out corner portions of the interposer 140 and the portions 160c and then performing a vertical cutting process cutting through the molding compound 160, so that the scribe lanes SL with cut edges are formed (see FIG. 13).

Figure 7:
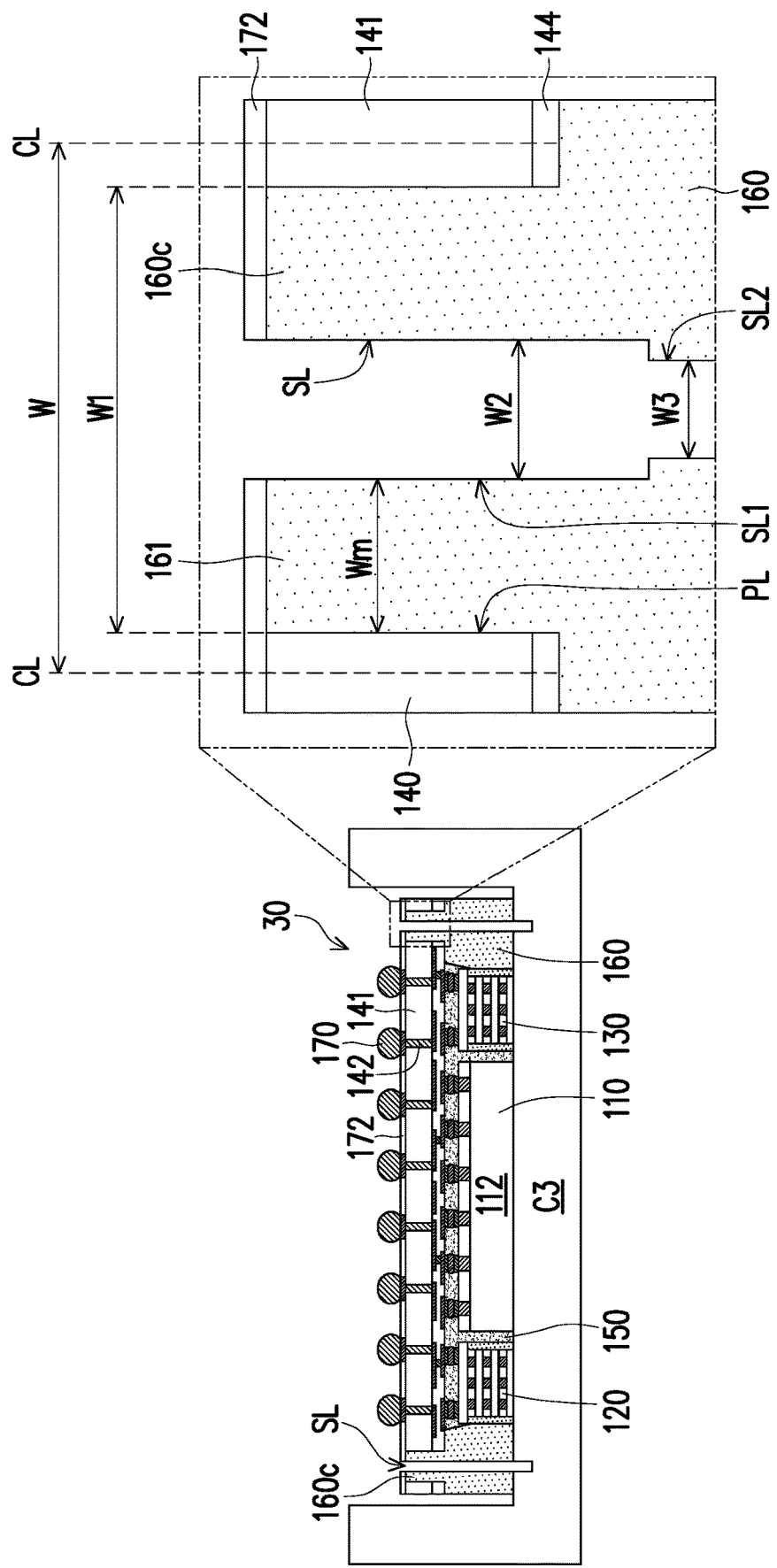

FIG. 7 is an enlarged cross-sectional view showing the relative sizes and the arrangement of the cutting lane CL, the pre-cut lane PL and the scribing lane SL. In some embodiments, the width W2 of the scribing lane SL is only a fraction of and is smaller than the width W1 of the pre-cut lane. Depending on the cutting depth during the singulation process, the dicing or cutting process may be performed in two stages. For example, the first stage cutting process with the first blade creates the first scribing lane SL1 with the width W2 of about 45 microns and the second stage cutting process with the second blade creates the second scribing lane SL2 with the width W3 of about 35 microns, and the cutting depth ratio of the first stage cutting process to the second stage cutting process may be about 1:5. Alternatively, if the cutting depth is not very large, one stage cutting process is used.

Referring to FIG. 6 & FIG. 7, the scribing lane SL is located within the span of the pre-cut lane PL. In one embodiment, the scribing lane SL is positioned in the middle of the pre-cut lane PL. In some embodiments, the cutting lane CL has the width W of about 180 microns, the pre-cut lane PL has the width W1 of about 160 microns, and the scribing lane SL has the width W2 of about 45 microns. The position of the scribing lane SL may be modified or adjusted to ensure the width Wm of the remaining portion 161 (that is located beside and inner than the scribing lane SL) of the cutting lane portion 160c is larger than zero and at least equivalent to or larger than about 50 microns. Taking the width W1 of the pre-cut lane PL being about 160 microns as an example, the width Wm of the remaining portion 161 (that is located beside and inner than the scribing lane SL) of the cutting lane portion 160c ranges from about 50 microns to about 70 microns.

Referring to FIG. 8, after removing the carrier C3, the individual semiconductor package 80 is obtained. In FIG. 8, the molding compound 160 encapsulates the semiconductor dies 110, 120, 130, laterally encapsulates the interposer 140 and covers side surfaces 140s of the interposer 140. In some embodiments, as seen in FIG. 8, the remaining portion(s) 161 of the molding compound 160 has a bottom surface 161b levelled with and coplanar with the surface 141b of the interposer 140. In some embodiments, the whole side surfaces 140s of the interposer are protected by the molding compound 160. Talking the package unit of a rectangular shape as an example, the ring-shaped remaining portion 161 of the molding compound 160 fully covers and protects all the four side surfaces 140s of the interposer 140. As described in the previous paragraphs, the remaining portion 161 that is located on the sidewalls 140s of the interposer 140 has a width Wm of about 50 microns or more to well protect the side surfaces 140s of the interposer 140, so as to relieve the corner stress and prevent delamination and cracking at the corner(s) of the interposer 140. Hence, the reliability of the package structure is significantly improved and the cracking risk is lowered by about 50%.

Figure 9:
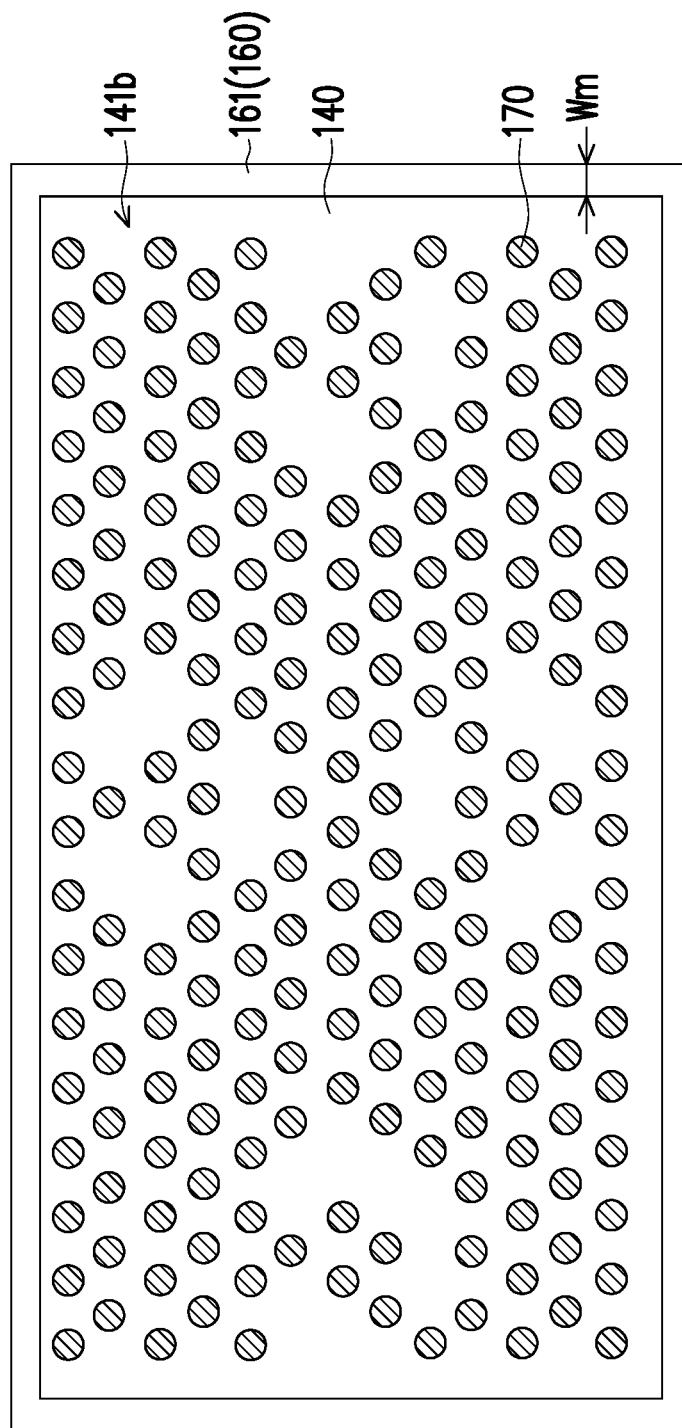
FIG. 9 is a schematic bottom view of a semiconductor package according to some embodiments of the present disclosure.
Figure 10:
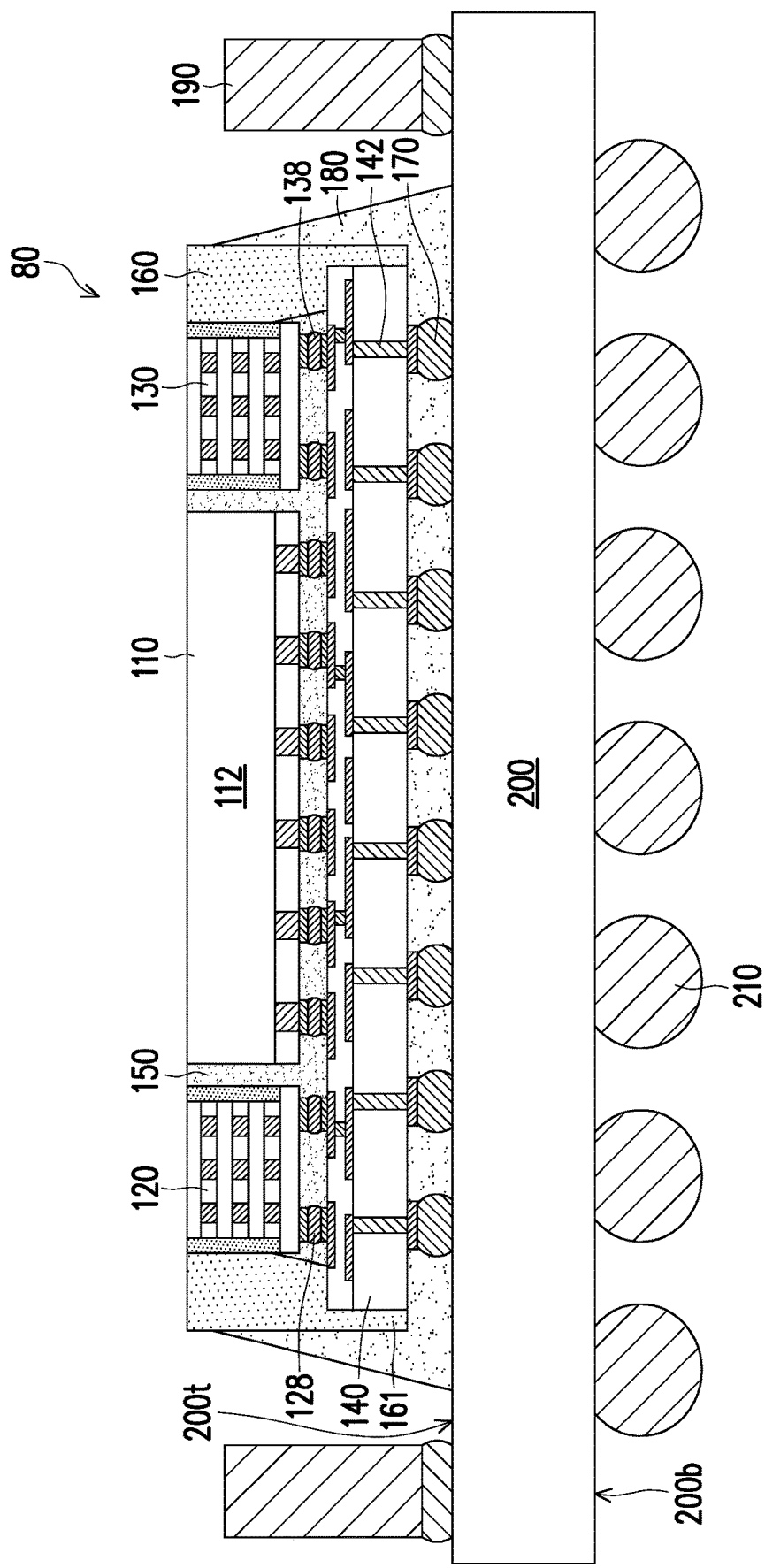
FIG. 10 is a schematic cross-sectional view illustrating a semiconductor package connected to a circuit substrate according to some embodiments of the present disclosure.

FIG. 9 is a schematic bottom view of an example of the semiconductor package 80 in FIG. 8. FIG. 10 is a schematic cross-sectional view illustrating a semiconductor package connected to a circuit substrate according to some embodiments of the present disclosure. According to some embodiments of the present disclosure, a semiconductor package 80 (shown in FIG. 8) is provided via the steps illustrated in FIG. 1 through FIG. 8.

In some embodiments, as illustrated in FIG. 9, from the bottom view of the semiconductor package 80, it is seen that the remaining portion(s) 161 of the molding compound 160 surrounds the interposer 140, and the bottom surface 141b of the interposer 140 is exposed. In FIG. 9, the layer 172 is omitted for illustration purposes, and the remaining portion 161 is seen as a rectangular ring shape having a width Wm and surrounding four sides of the interposer 140.

Referring to FIG. 10, the semiconductor package 80 is bonded to a top surface 200t of a circuit substrate 200 via the connectors 170. In some embodiments, the circuit substrate 200 includes a printed circuit board, a laminated board or a flexible laminate board. In some embodiments, the circuit substrate 200 includes one or more active components, passive components, or a combination thereof. In some embodiments, the circuit substrate 200 may also include metallization layers (not shown), though vias (not shown), and bond pads (not shown) connected to the metallization layers and the vias to provide, for example, dual-side electrical connection. The metallization layers may be formed over the active and passive components and may be designed to connect the various components to form functional circuitry. In embodiments, conductive balls 210 are formed on the bottom surface 200b of the circuit substrate 200 for further electrical connection.

In some embodiments, another underfill 180 may be provided and filled into the gaps between the connectors 170 and between the semiconductor package 80 and the circuit substrate 200. In some embodiments, the material and the manufacturing method of the underfill 180 may be similar to the materials and manufacturing methods described for the underfill 150, and a detailed description thereof is omitted herein. In some embodiments, referring to FIG. 10, a structure 190 may be optionally provided on the circuit substrate 200, and the structure 190 may be a support structure, a heat sink, or a partition member.

FIG. 11 through FIG. 15 are schematic cross-sectional views illustrating portions of some semiconductor packages according to some embodiments of the present disclosure. FIG. 16 is a schematic bottom view of an example of the semiconductor package of FIG. 13.

Figure 11:
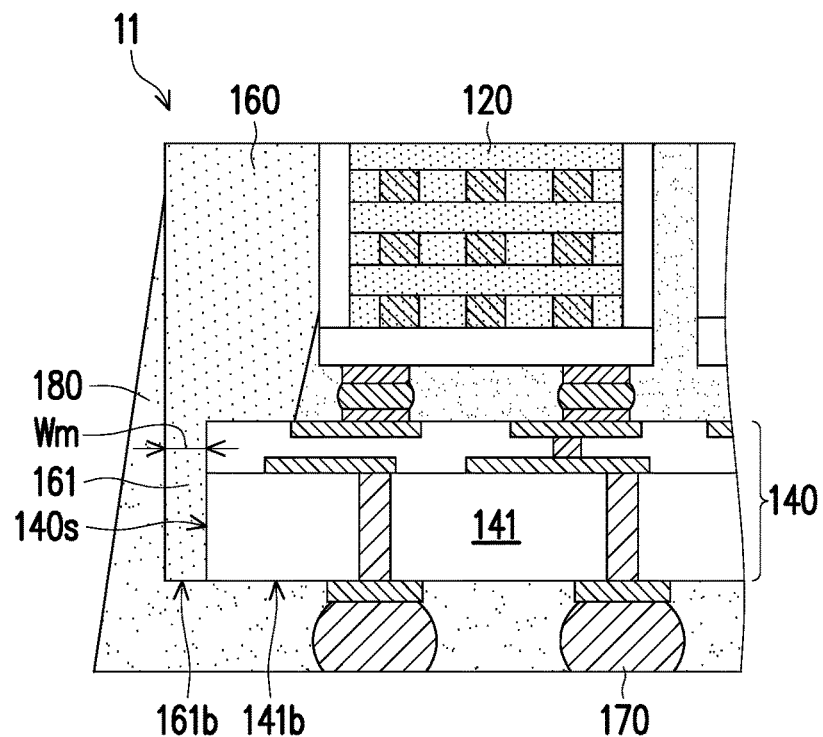
FIG. 11 through FIG. 15 are schematic cross-sectional views illustrating portions of some semiconductor packages according to some embodiments of the present disclosure.

Referring to FIG. 11, the semiconductor package 11 may be produced following the processes described from FIG. 1 to FIG. 8. In some embodiments, the molding compound 160 encapsulates the semiconductor die 120 and laterally wraps the interposer 140, and the molding compound 160 fully covers all the side surfaces 140s of the interposer 140. In some embodiments, the remaining portion 161 refers to the portion of the molding compound 160 that is located on the side surfaces (i.e. sidewalls) 140s of the interposer 140, and the bottom surface 161b of the remaining portion(s) 161 is levelled with and coplanar with the surface 141b of the interposer 140.

Figure 12:
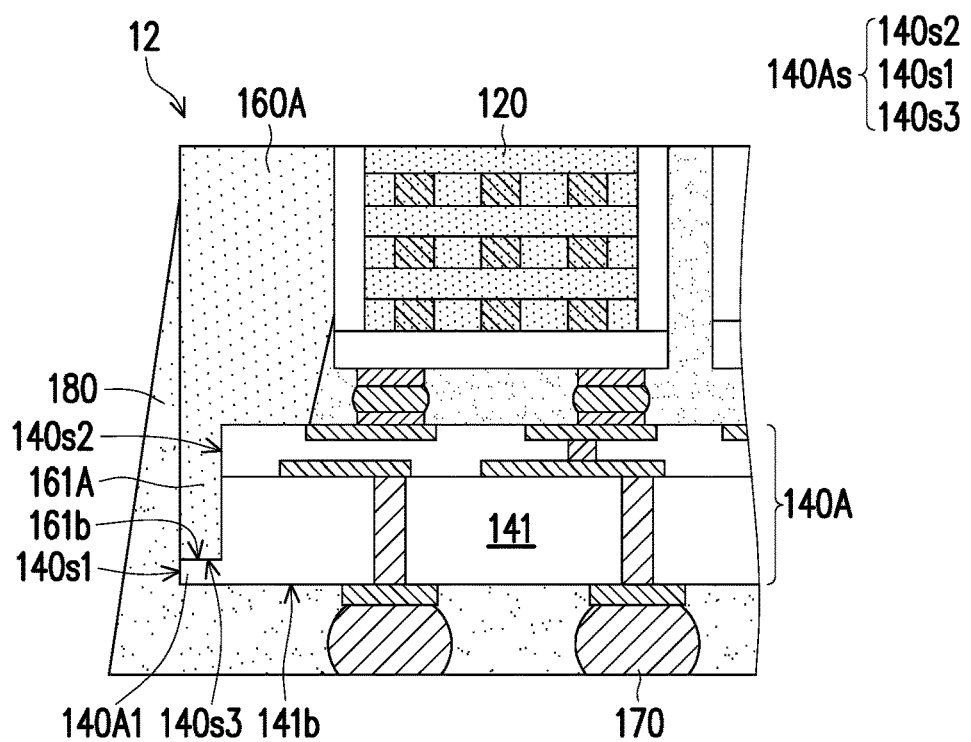

Referring to FIG. 12, the structure of the semiconductor package 12 is similar to the semiconductor package 11, except that the interposer 140A has a stair-shaped sidewall 140As. That is, the side surfaces of the interposer 140A form the stair-shaped sidewall 140As. Talking the package unit of a rectangular shape as an example, at least one sidewall of the four sidewalls of the interposer 140A includes a stair-shaped sidewall. In some embodiments, all the sidewalls of the interposer 140A include stair-shaped sidewalls. In some embodiments, the stair-shaped sidewall 140As has a vertical sidewall 140s1 extending from the bottom surface 141b of the interposer 140A to the bottom surface 161b of the remaining portion 161A and a vertical sidewall 140s2 extending from the bottom surface 161b of the remaining portion 161A to the top surface of the interposer 140A. The surface 140s3 is the horizontal surface connecting the vertical sidewalls 140s1 & 140s2. In some embodiments, the remaining portion 161A refers to the portion of the molding compound 160A that contacts the surface 140s3 and the sidewall 140s2 of the interposer 140A. In FIG. 12, the bottom surface 161b of the remaining portion(s) 161A is located higher than the surface 141b of the interposer 140A. In other words, the interposer 140A has an extended flange portion 140A1 (with the vertical sidewall 140s1 and the surface 140s3) protruded beyond and outside of the vertical sidewall 140s2. In FIG. 12, the sidewall 140s1 of the flange portion 140A1 is not covered by the molding compound 160. In some embodiments, the structure of the semiconductor package 12 may be produced following the similar processes described from FIG. 1 to FIG. 8, but the pre-cut lanes PL are formed with a depth smaller than the length of the conductive vias 142.

Referring to FIG. 13, the structure of the semiconductor package 13 is similar to the semiconductor package 11, except that the interposer 140B has a partial inclined sidewall 140Bs. In some embodiments, the partial inclined sidewall 140Bs has a slanted sidewall 140s4 extending from the bottom surface 141b of the interposer 140B to the bottom surface 161b of the remaining portion 161B and a vertical sidewall 140s5 extending from the bottom surface 161b of the remaining portion 161B to the top surface of the interposer 140B. In FIG. 13, the remaining portion 161B has a slanted bottom surface 161b (inclined inwardly). In some embodiments, the bottom surface 161b of the remaining portion 161B is coplanar with the slanted sidewall 140s4, as the structure of the semiconductor package 12 may be produced following the similar processes described from FIG. 1 to FIG. 8, except that the singulation process includes performing a bevel cutting process to cut off edge portions of the molding compound 160B and the edges of the interposer 140B. From FIG. 13 and the bottom view of FIG. 16, it is seen that a ring-shaped inclined sidewall (surface 161b+sidewall 140s4) is formed, and the remaining portion 161B covers the vertical sidewall 140s5 and protects the borders or edges between the vertical sidewall 140s5 and the slanted sidewall 140s4.

Figure 14:
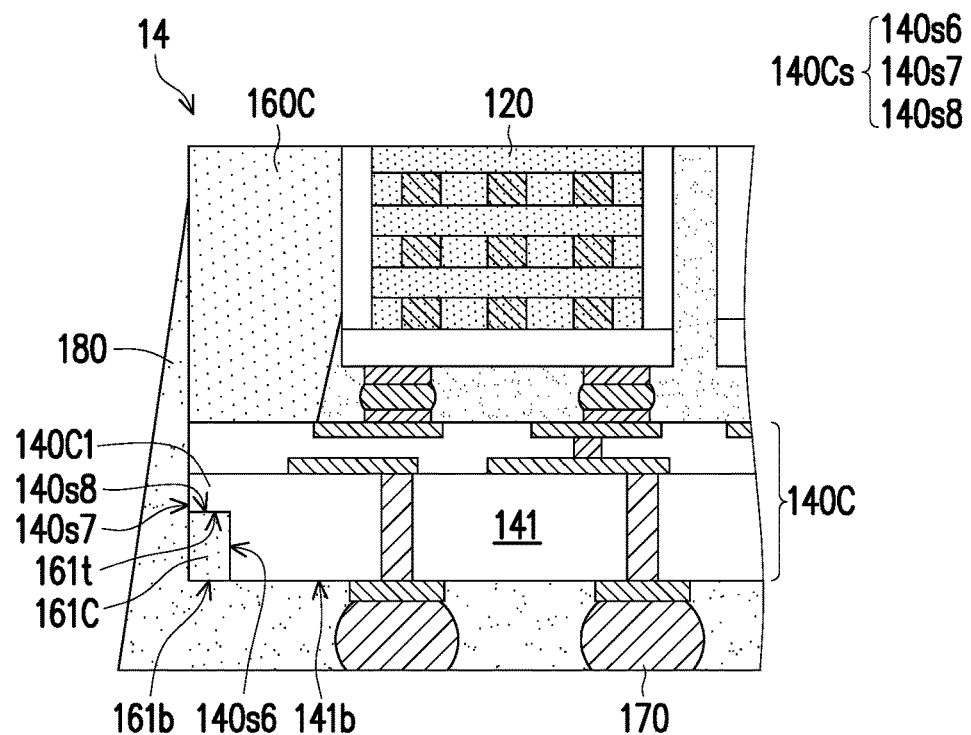

Referring to FIG. 14, the structure of the semiconductor package 14 is similar to the semiconductor package 11, except that the interposer 140C has a reverse stair-shaped sidewall 140Cs. In some embodiments, the reverse stair-shaped sidewall 140Cs has a vertical sidewall 140s6 extending from the bottom surface 141b of the interposer 140C to the top surface 161t of the remaining portion 161C and a vertical sidewall 140s7 extending from the top surface 161t of the remaining portion 161C to the top surface of the interposer 140C. The surface 140s8 is the connecting horizontal surface connecting the vertical sidewalls 140s6 & 140s7. In FIG. 14, the bottom surface 161b of the remaining portion(s) 161C is coplanar with the surface 141b of the interposer 140C. In other words, the interposer 140C has an extended flange portion 140C1 (with the vertical sidewall 140s7 and the surface 140s8) protruded beyond and outside of the vertical sidewall 140s6.

Figure 15:
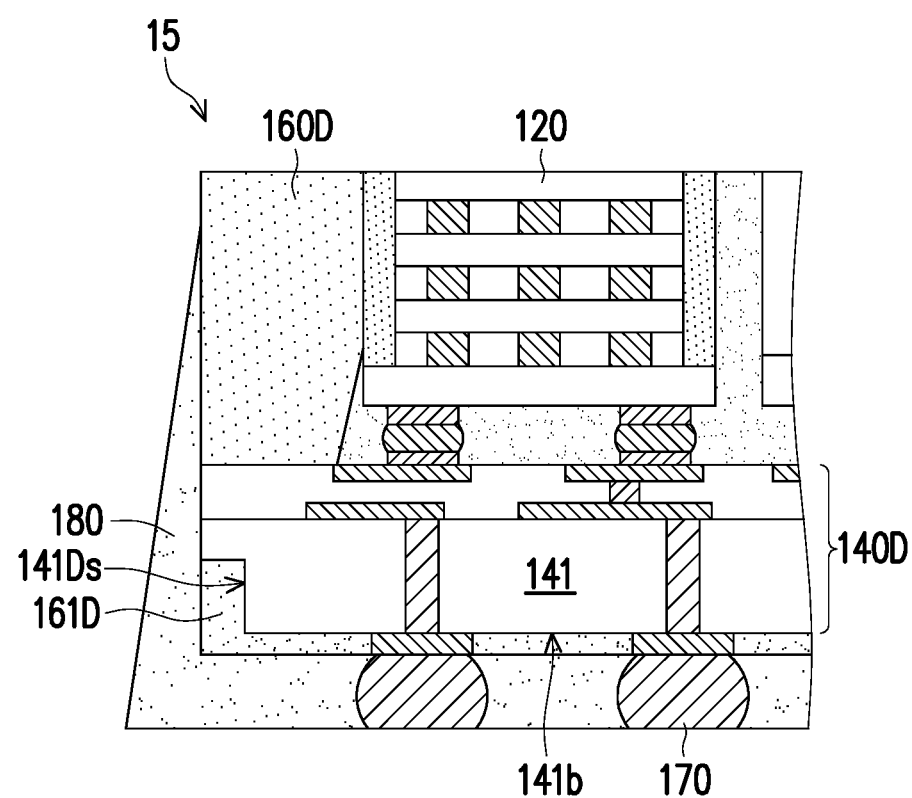
Figure 16:
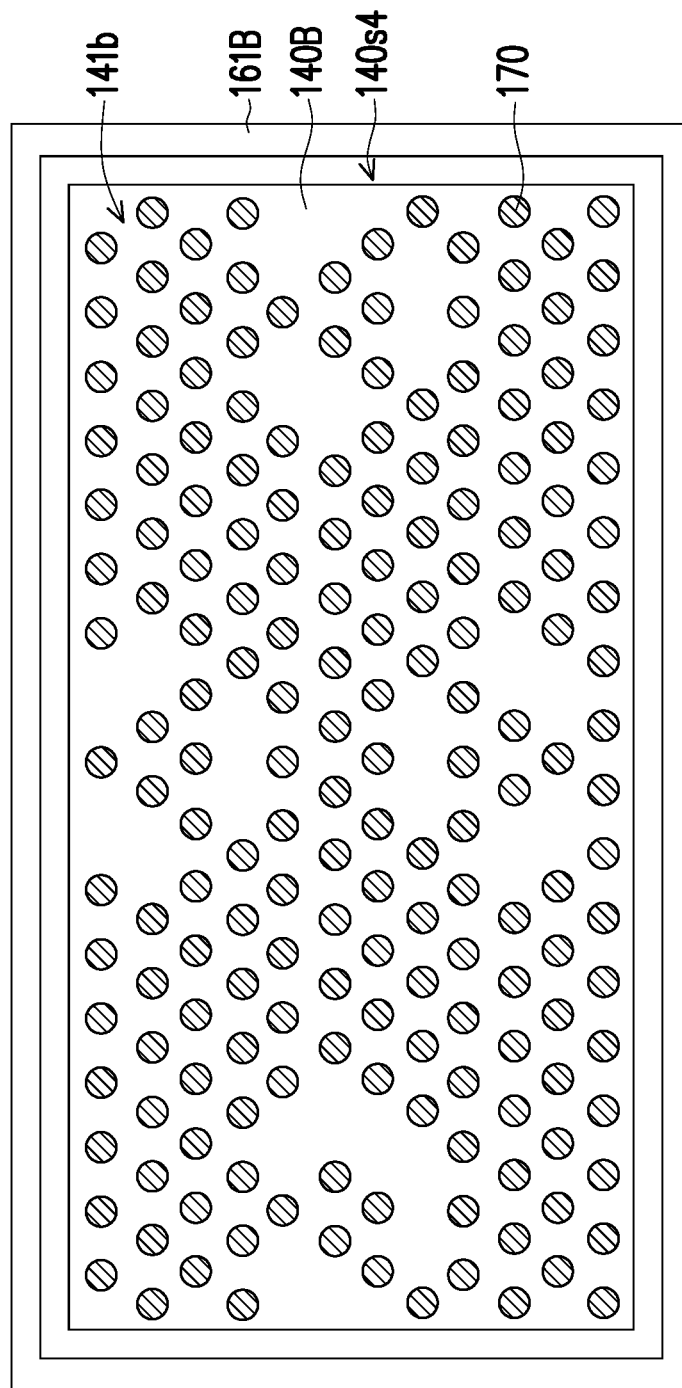
FIG. 16 is a schematic bottom view of a semiconductor package according to some embodiments of the present disclosure.

Referring to FIG. 15, the structure of the semiconductor package 15 is similar to the semiconductor package 14, except that the portion 161D of the molding compound 160D not only covers the sidewall(s) 141Ds but also further extends over and covers the bottom surface 141b of the interposer 140D.

Figure 23:
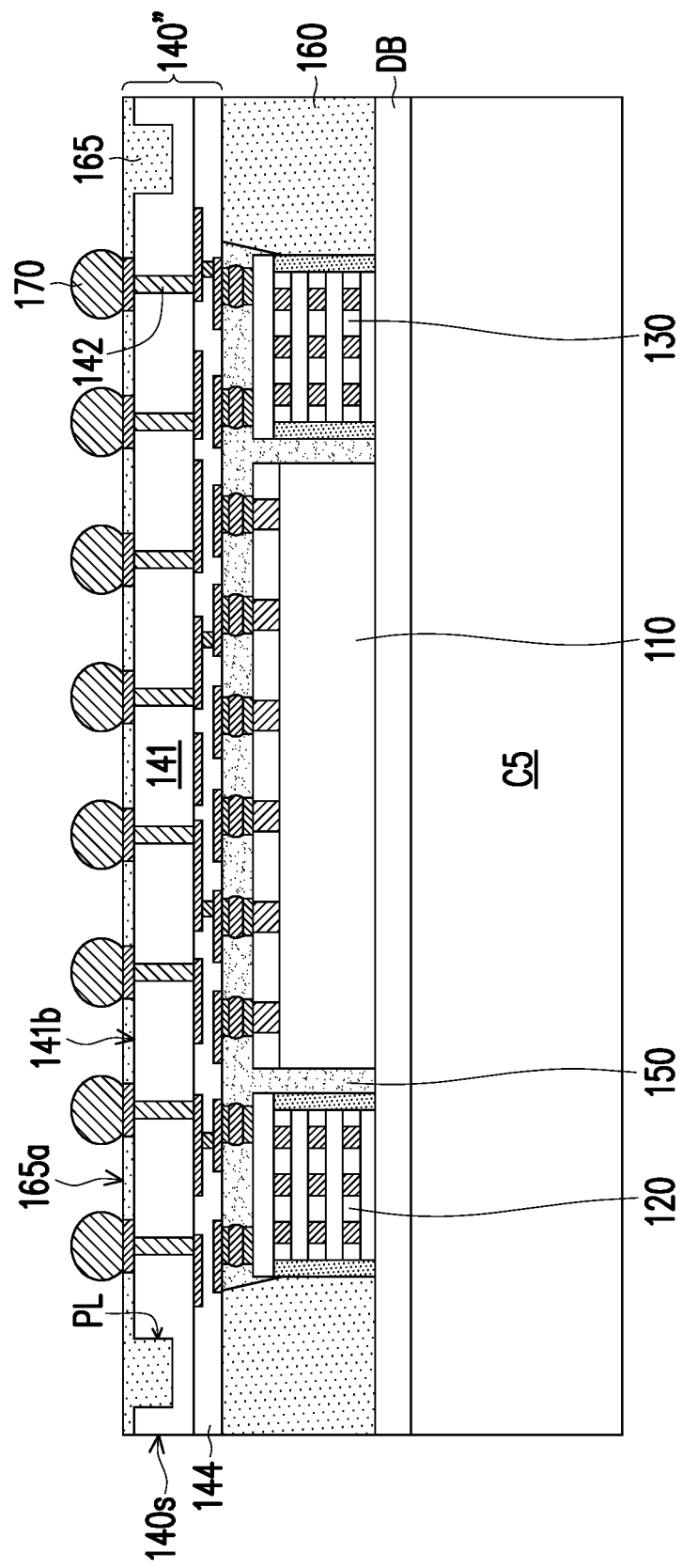
FIG. 23 through FIG. 24 are schematic cross-sectional views illustrating the structures formed following another manufacturing method of a semiconductor package according to some embodiments of the present disclosure.
Figure 24:
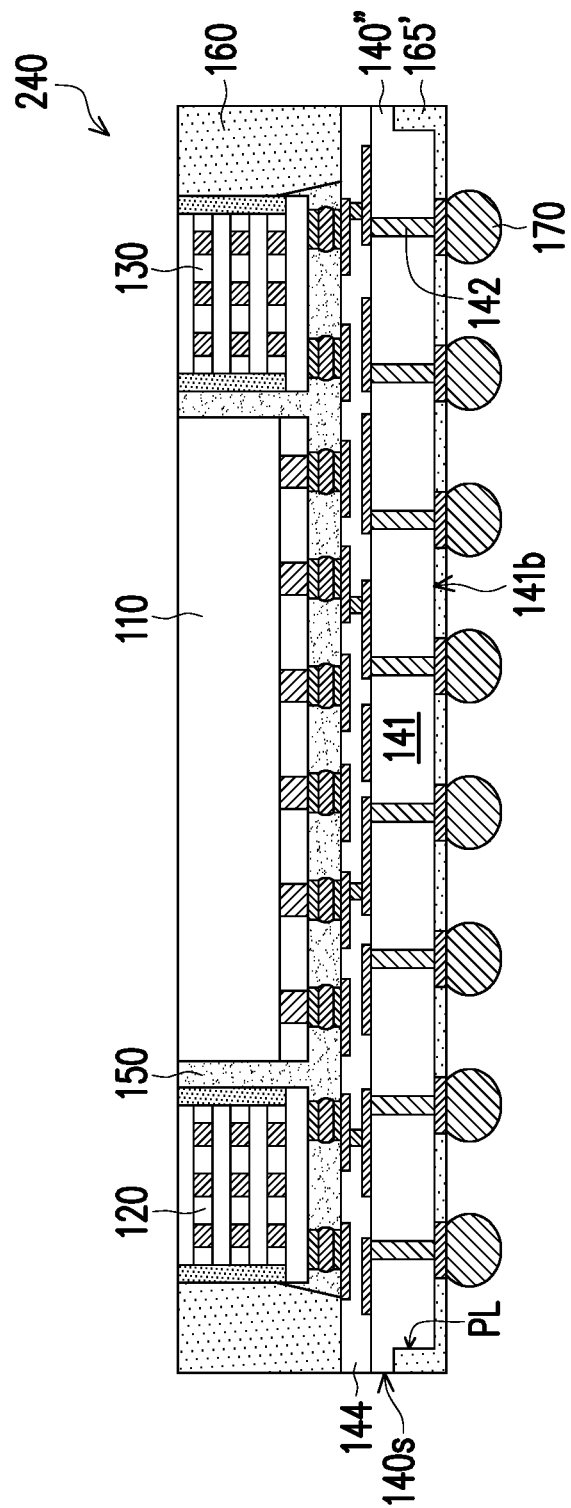

FIG. 17 through FIG. 22 are schematic cross-sectional views illustrating the structures formed at various stages of one manufacturing method of a semiconductor package according to some embodiments of the present disclosure. FIG. 23 through FIG. 24 are schematic cross-sectional views illustrating the structures formed following another manufacturing method of a semiconductor package according to some embodiments of the present disclosure.

Figure 17:
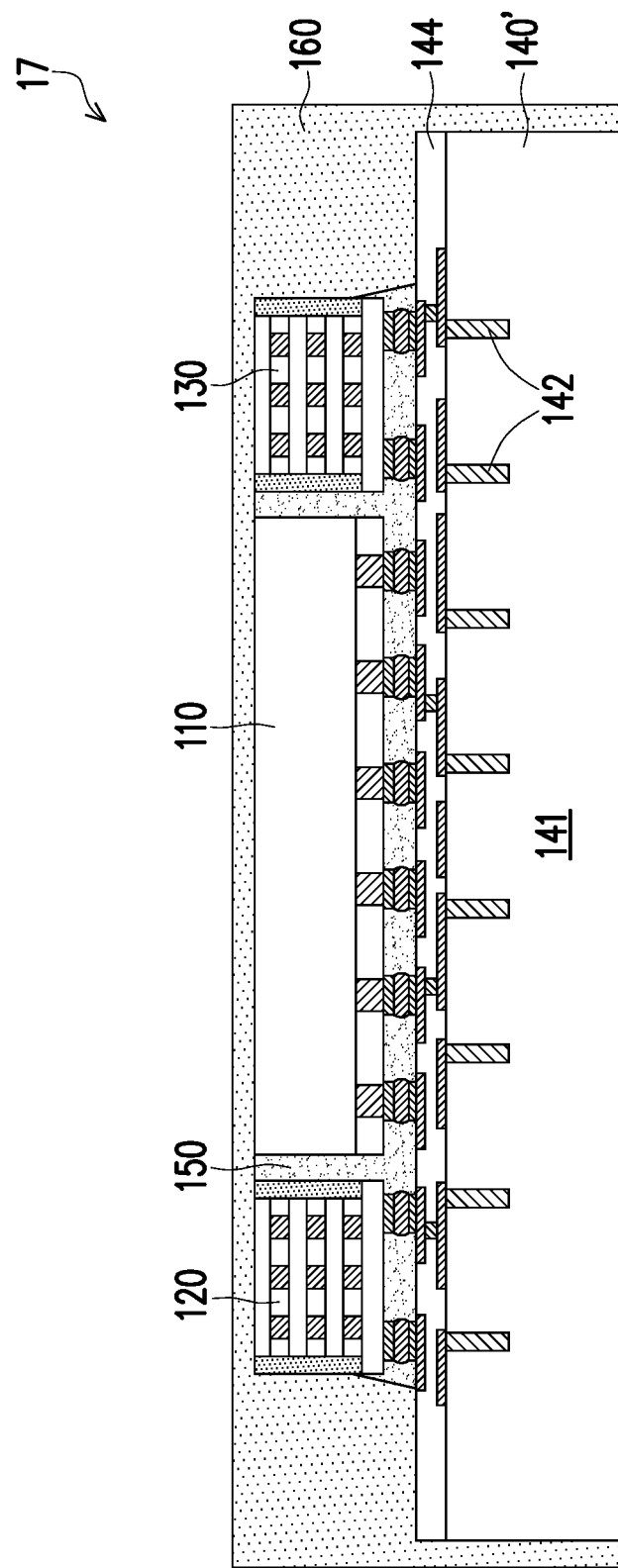
FIG. 17 through FIG. 22 are schematic cross-sectional views illustrating the structures formed at various stages of a manufacturing method of a semiconductor package according to some embodiments of the present disclosure.

Referring to FIG. 17, a molded structure 17 is formed. In some embodiments, the molded structure 17 may be similar to the molded structure of FIG. 3, and the molded structure 17 may be formed following the processes depicted from FIG. 1 to FIG. 3, except for skipping the forming of the pre-cut lanes in the interposer 140'. The descriptions of the same or similar parts will be omitted for the sake of brevity.

Figure 18:
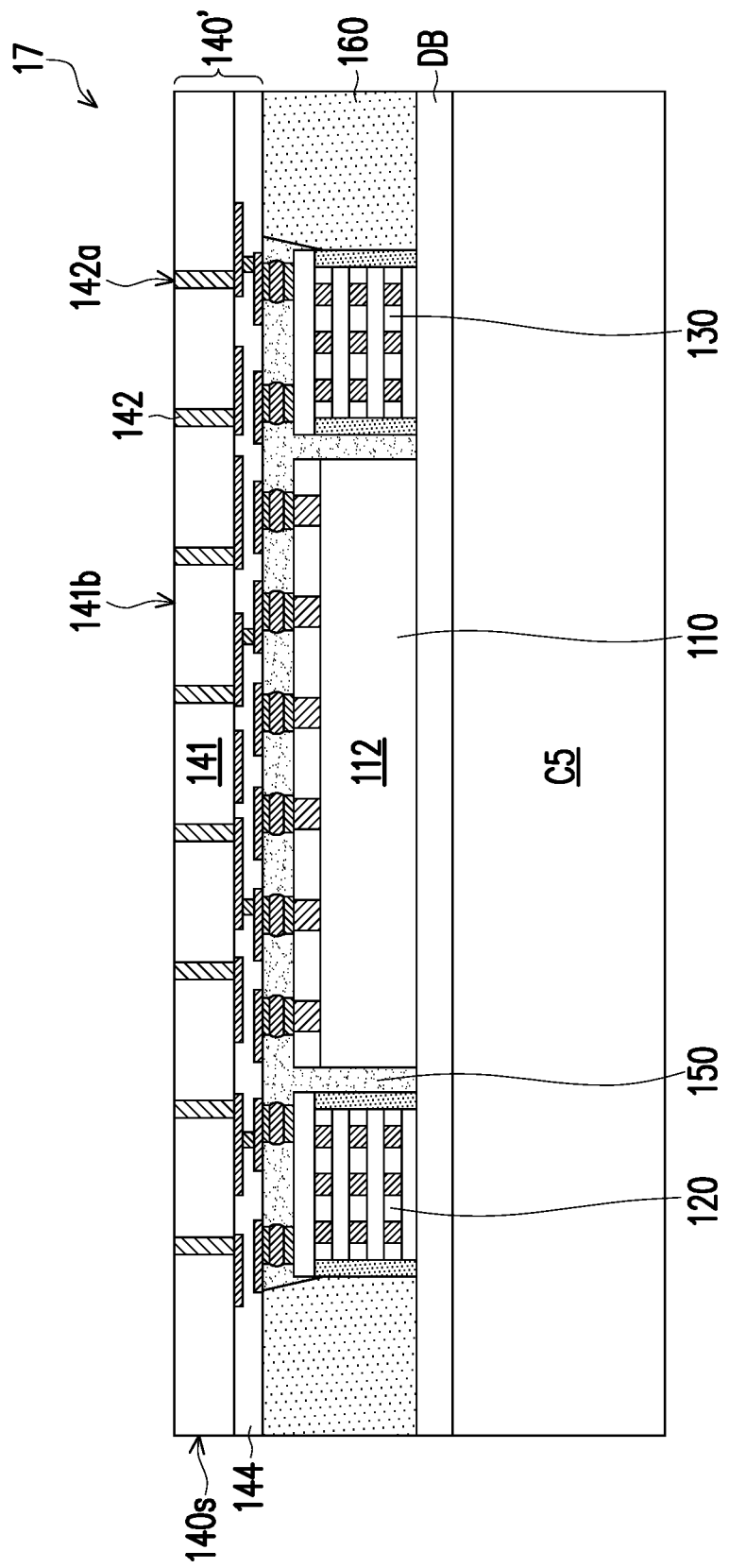

Referring to FIG. 18, a trimming process and a planarization process are performed to the molded structure 17. In some embodiments, the trimming process removes edge portions of the molded structure 17 so that the side surfaces 140s of the interposer 140' are exposed. In some embodiments, the planarization process is performed to the molded structure 17 to remove the extra molding compound 160 above the semiconductor dies 110, 120, 130. In some embodiments, the molded structure 17 is turned upside down and transferred to a temporary carrier C5 having a de-bonding layer DB formed thereon. In some embodiments, a thinning process is performed to the backside of the interposer 140' until the ends 142a of the conductive vias 142 are exposed. In some embodiments, the ends 142a of the conductive vias 142 are exposed from the surface 141b of the bulk substrate 141 of the thinned interposer 140'. That is, the ends 142a of the conductive vias 142 are co-levelled and coplanar with the surface 141b of the bulk substrate 141.

Figure 19:
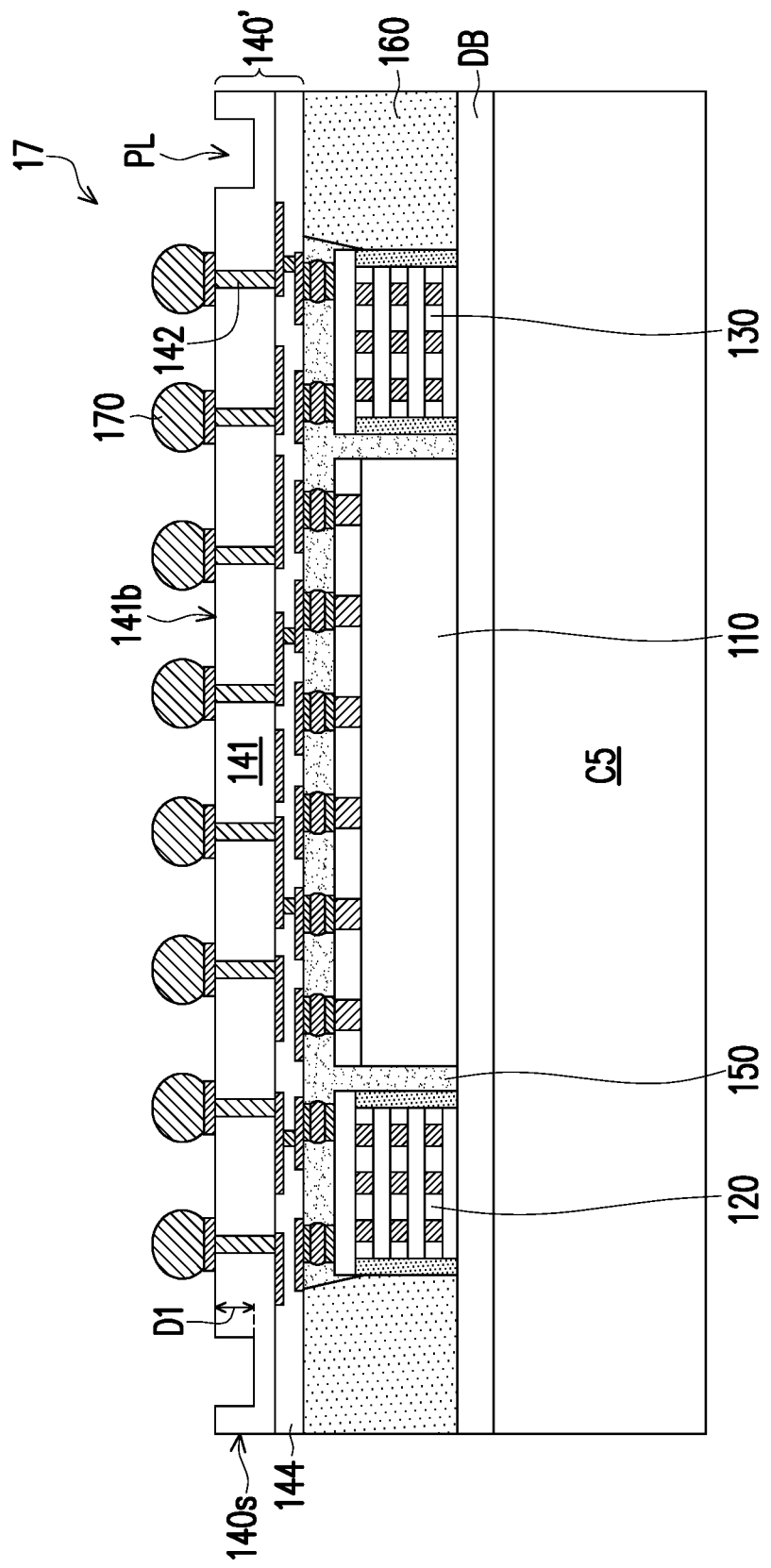

Referring to FIG. 19, pre-cut lanes PL are formed in the bulk substrate 141 of the interposer 140'. Similarly, a pre-cutting process is performed to the interposer 140' along the cutting lanes CL (not shown) to form pre-cut lanes PL in the interposer 140'. In some embodiments, the pre-cut lanes PL are cut into the bulk substrate 141 of the interposer 140' with a depth D1. In some embodiments, the pre-cut lanes PL do not penetrate through the whole bulk substrate 141. In some embodiments, the connectors 170 are formed on and connected with the exposed conductive vias 142.

Figure 20:
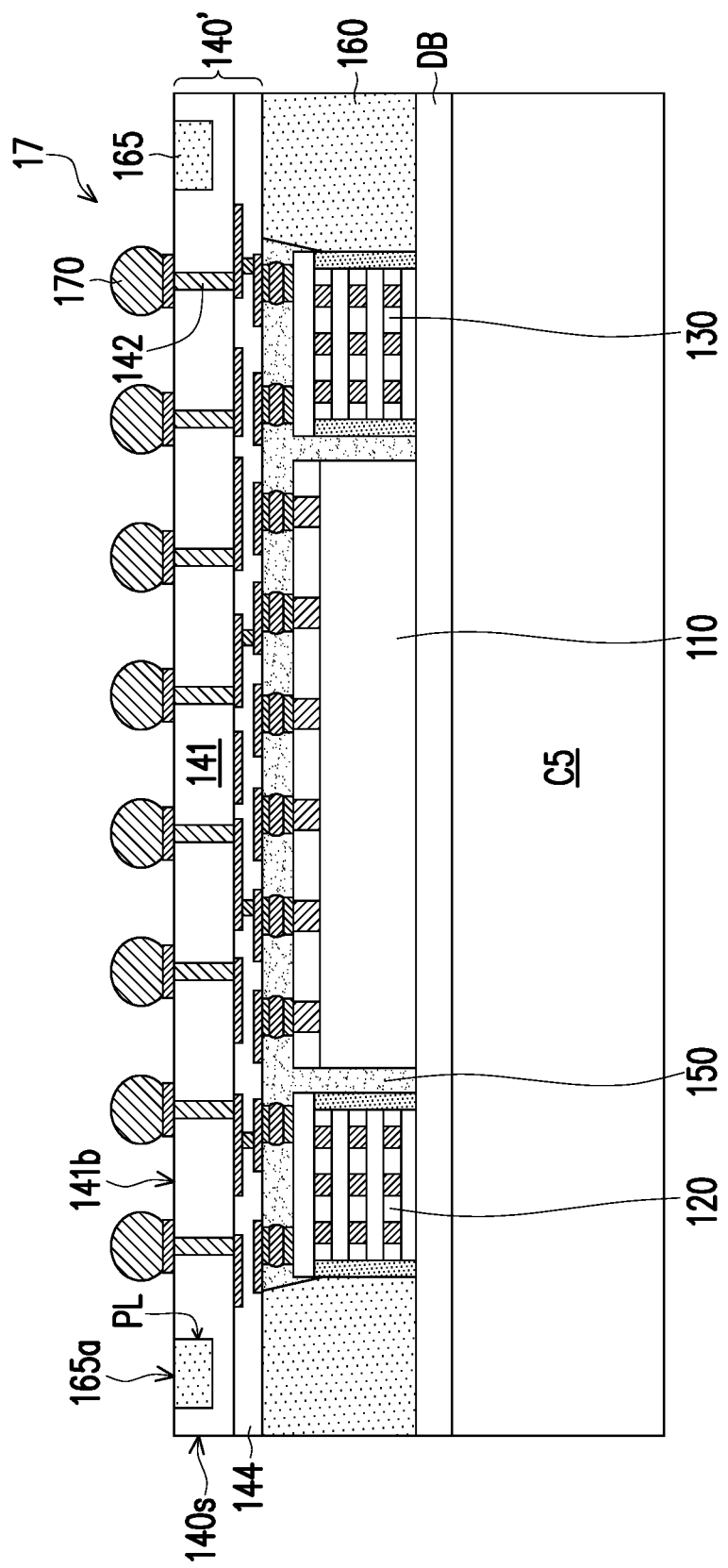

Referring to FIG. 20, a filling material 165 is filled in the pre-cut lanes PL. In some embodiments, the filling material 165 fills up the pre-cut lanes PL and the top surface 165a of the filling material 165 is coplanar and levelled with the surface 141b of the bulk substrate 141. In one embodiment, the material of the filling material 165 is different from that of the molding compound 160. In one embodiment, the material of the filling material 165 is the same as that of the molding compound 160. In some embodiments, when the materials of the filling material 165 and the molding compound 160 are substantially the same, the filling material 165 may be considered as part of the molding compound but is formed in a later manufacturing process.

Figure 21:
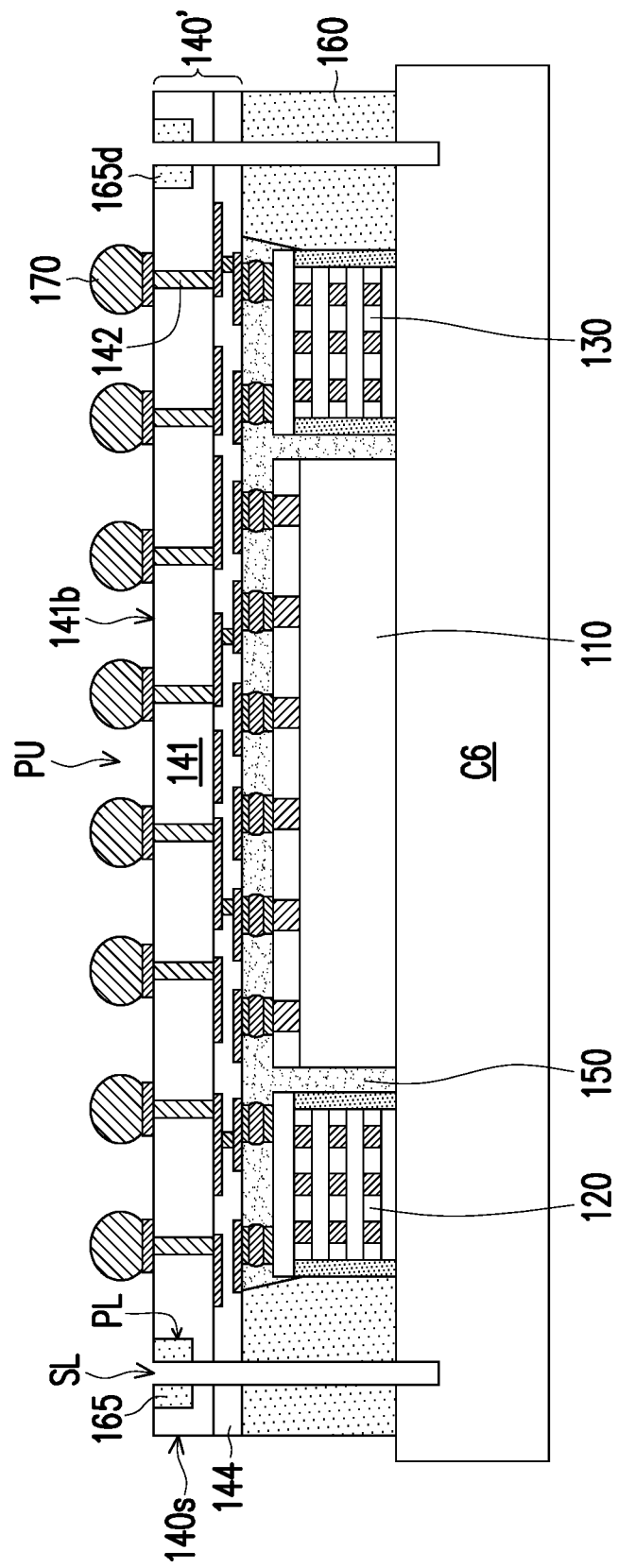

Referring to FIG. 21, in some embodiments, the molded structure 17 is transferred to another carrier C6 and a singulation process is performed to the molded structure 17 to separate the individual package units PU, for example, by cutting through the filling material 165 of the molded structure 17 along the pre-cut lanes PL. In some embodiments, the singulation process includes performing a wafer dicing process with a rotating blade. In some embodiments, the singulation process includes performing a laser cutting process. In some embodiments, the dicing or cutting process is performed cutting through the filling material 165, cutting through the molding compound 160 and cutting into the carrier C6 to form scribing lanes SL and to separate the package unit(s) PU. Through the formation of the scribing lanes SL, the package unit PU is singulated, and a portion of the filling material 165 is cut off and separate from the remaining portion 165d of the filling material 165.

Figure 22:
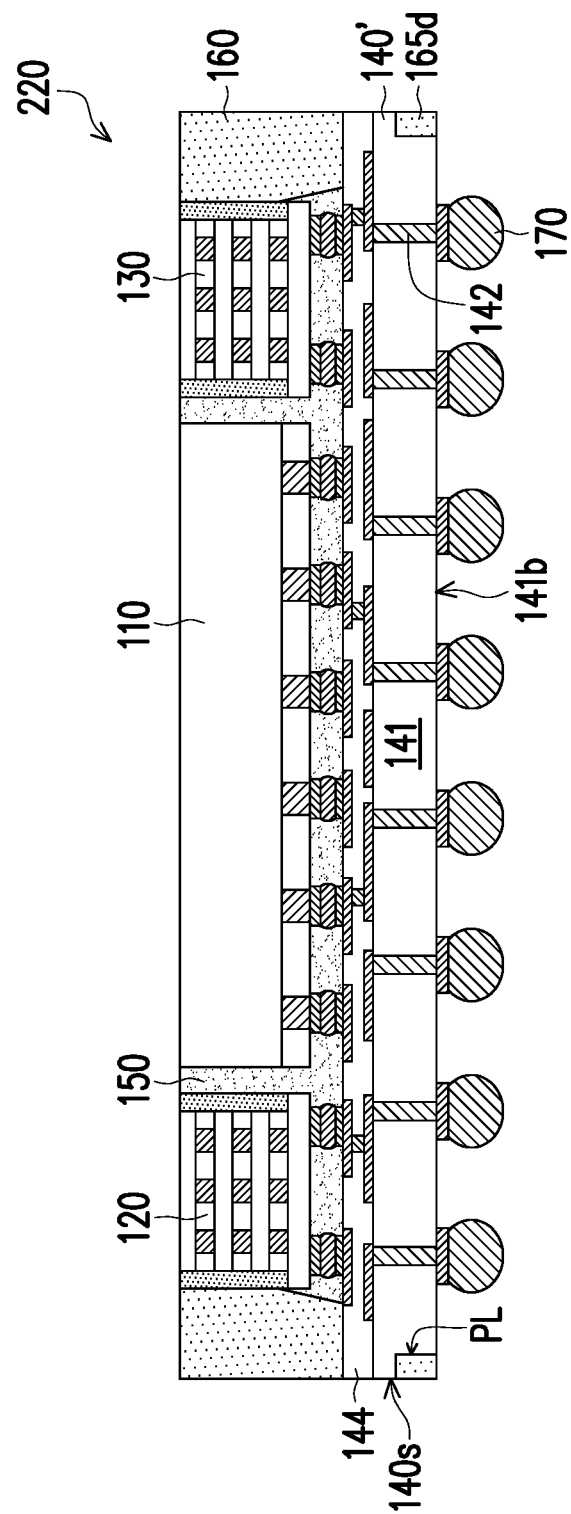

Referring to FIG. 22, after removing the carrier C6, the individual semiconductor package 220 is obtained. In FIG. 22, the molding compound 160 encapsulates the semiconductor dies 110, 120, 130, and upper parts of the sidewalls 140s of the interposer 140' are exposed. In some embodiments, the remaining portion(s) 165d of the filling material 165 covers and protects the lower parts of the sidewalls 140s of the interposer 140'. As described in the previous paragraphs, the semiconductor package 220 is similar to the semiconductor package 14 of FIG. 14, the remaining portion 165d that is located on the lower parts of the sidewalls 140s of the interposer 140' has a width Wm of about 50 microns or more to well protect the edges or corners of the interposer 140', so as to relieve the corner stress and prevent delamination and cracking at the corner(s) of the interposer 140'. Hence, the reliability of the package structure is significantly improved and the cracking risk is lowered by about 50%.

In alternative embodiments, as shown in FIG. 23, the filling material 165 not only fills up the pre-cut lanes but also covers the surface 141b of the bulk substrate 141 of the interposer 140". That is, the top surface 165a of the filling material 165 is higher than the surface 141b of the bulk substrate 141.

Referring to FIG. 23 and FIG. 24, the singulation process is performed cutting through the filling material 165 of the molded structure along the pre-cut lanes PL. As described in the previous paragraphs, the semiconductor package 240 is similar to the semiconductor package 15 of FIG. 15, and the remaining filling material 165' not only covers the lower parts of the sidewalls 140s but also covers the bottom surface 141b of the interposer 140".

Based on the above, a semiconductor package according to the present disclosure may include one or more semiconductor dies disposed on an interposer and a molding compound encapsulating the semiconductor die(s). In some embodiments, the molding compound covers and protects a portion or the whole sidewall(s) of the interposer. In some embodiments, the semiconductor package further includes a filling material covering and protecting a portion or the whole sidewall(s) of the interposer.

In some embodiments of the present disclosure, a semiconductor package is provided. The semiconductor package includes at least one semiconductor die, an interposer, a molding compound and connectors. The interposer has a first surface, a second surface opposite to the first surface and sidewalls connecting the first and second surfaces. The at least one semiconductor die is disposed on the first surface of interposer and electrically connected with the interposer. The molding compound is disposed over the interposer and laterally encapsulates the at least one semiconductor die. The molding compound laterally wraps around the interposer and the molding compound at least physically contacts a portion of the sidewalls of the interposer. The connectors are disposed on the second surface of the interposer, and are electrically connected with the at least one semiconductor die through the interposer.

In some embodiments of the present disclosure, a semiconductor package is provided. The semiconductor package includes semiconductor dies, an interposer, a molding compound, connectors and a circuit substrate. The interposer has a first surface, a second surface opposite to the first surface and sidewalls connecting the first and second surfaces. The semiconductor dies are disposed on the first surface of interposer and electrically connected with the interposer.

The molding compound is disposed over the interposer and laterally encapsulates the semiconductor dies. The molding compound laterally wraps around the interposer and a portion of the molding compound physically contacts the sidewalls of the interposer. The circuit substrate is disposed below the interposer and electrically connected with the at least one die. The connectors are disposed between the second surface of the interposer and the circuit substrate.

In some embodiments of the present disclosure, a manufacturing method of a semiconductor package is provided. The manufacturing method includes the following steps. An interposer is provided and semiconductor dies are provided. The semiconductor dies are bonded to a mounting surface of the interposer. Pre-cut lanes are formed in the interposer. A molding compound is formed over the interposer to encapsulate the semiconductor dies to form a molded structure. A singulation process is performed to the molded structure by cutting through the molding compound through the pre-cut lanes to form individual semiconductor packages.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package, comprising:
   an interposer having a first surface, a second surface opposite to the first surface and sidewalls connecting the first and second surfaces, wherein at least one sidewall of the sidewalls of the interposer is a stair-shaped sidewall, a partial inclined sidewall or a reverse stair-shaped sidewall;
   semiconductor dies, disposed on the first surface of the interposer and electrically connected with the interposer;
   a molding compound, disposed over the interposer and laterally encapsulating the semiconductor dies, wherein the molding compound laterally wraps around the interposer and a portion of the molding compound physically contacts the sidewalls of the interposer;
   a circuit substrate, disposed below the interposer and electrically connected with semiconductor dies;
   connectors, disposed between the second surface of the interposer and the circuit substrate; and
   an underfill filled between the interposer, the circuit substrate and the connectors.

2. The semiconductor package of claim 1, wherein the interposer includes through vias and the connectors are connected with the through vias of the interposer.

3. The semiconductor package of claim 1, wherein the at least one sidewall of the sidewalls of the interposer is the stair-shaped sidewall, the molding compound physically contacts an upper portion of the stair-shaped sidewall, and the underfill physically contacts a lower portion of the stair-shaped sidewall.

4. The semiconductor package of claim 3, wherein the molding compound that physically contacts the upper portion of the stair-shaped sidewall has a bottom surface higher than the second surface of the interposer.

5. The semiconductor package of claim 1, wherein the at least one sidewall of the sidewalls of the interposer is the partial inclined sidewall, and the partial inclined sidewall consists of a vertical sidewall extending from the first surface of the interposer and a slanted sidewall connected with the vertical sidewall and extending to the second surface of the interposer.

6. The semiconductor package of claim 5, wherein the molding compound that physically contacts the vertical sidewall has a slanted bottom surface coplanar with the slanted sidewall, and the underfill physically contacts the slanted sidewall.

7. The semiconductor package of claim 1, wherein the at least one sidewall of the sidewalls of the interposer is the reverse stair-shaped sidewall, the molding compound physically contacts a lower portion of the reverse stair-shaped sidewall, and the underfill physically contacts an upper portion of the reverse stair-shaped sidewall.

8. The semiconductor package of claim 7, wherein the molding compound further covers the second surface of the interposer.

9. A semiconductor package, comprising:
an interposer having a first surface, a second surface opposite to the first surface and sidewalls connecting the first and second surfaces, wherein the interposer has a flange portion;
semiconductor dies, disposed on the first surface of the interposer and electrically connected with the interposer;
a circuit substrate, disposed below the interposer and connected to the second surface of the interposer, wherein the semiconductor dies are electrically connected with the circuit substrate through the interposer;
a molding compound, disposed over the interposer and laterally encapsulating the semiconductor dies, wherein the molding compound laterally wraps around the interposer and a portion of the molding compound physically contacts the sidewalls of the interposer; and
an underfill filled between the interposer, the molding compound and the circuit substrate.

10. The semiconductor package of claim 9, wherein the portion of the molding compound is located directly on the flange portion and physically contacts an upper portion of the sidewalls of the interposer without covering sidewalls of the flange portion, and a bottom surface of the portion is higher than the second surface of the interposer.

11. The semiconductor package of claim 10, wherein the underfill physically contacts the flange portion.

12. The semiconductor package of claim 9, wherein the portion of the molding compound is located directly on the flange portion and physically contacts a lower portion of the sidewalls of the interposer without covering sidewalls of the flange portion, and a bottom surface of the portion is levelled with the second surface of the interposer.

13. The semiconductor package of claim 12, wherein the underfill physically contacts the flange portion.

14. The semiconductor package of claim 9, wherein the portion of the molding compound physically contacts a lower portion of the sidewalls of the interposer and the second surface of the interposer.

15. The semiconductor package of claim 14, wherein the underfill physically contacts the flange portion.

16. A semiconductor package, comprising:
an interposer having a first surface, a second surface opposite to the first surface and sidewalls connecting the first and second surfaces, wherein the interposer has a flange portion;
semiconductor dies, disposed on the first surface of the interposer and electrically connected with the interposer;
a first underfill, disposed between the semiconductor dies and the first surface of the interposer;
a circuit substrate, disposed below the interposer and connected to the second surface of the interposer, wherein the semiconductor dies are electrically connected with the circuit substrate through the interposer;
a molding compound, disposed over the interposer, covering the first underfill and laterally encapsulating the semiconductor dies, wherein the molding compound laterally wraps around the interposer and a portion of the molding compound physically contacts the sidewalls of the interposer; and
a second underfill filled between the interposer, the molding compound and the circuit substrate.

17. The semiconductor package of claim 16, wherein the portion of the molding compound is located directly on the flange portion and physically contacts an upper portion of the sidewalls of the interposer without covering sidewalls of the flange portion, and a bottom surface of the portion is higher than the second surface of the interposer, and the second underfill physically contacts the flange portion.

18. The semiconductor package of claim 16, wherein the portion of the molding compound is located directly on the flange portion and physically contacts a lower portion of the sidewalls of the interposer without covering sidewalls of the flange portion, and a bottom surface of the portion is levelled with the second surface of the interposer, and the second underfill physically contacts the flange portion.

19. The semiconductor package of claim 16, wherein the portion of the molding compound physically contacts a lower portion of the sidewalls of the interposer and the second surface of the interposer, and the second underfill physically contacts the flange portion.

20. The semiconductor package of claim 16, further comprising connectors disposed between the second surface of the interposer and the circuit substrate.

* * * * *